US012745390B2

(12) United States Patent
Minemura

(10) Patent No.: US 12,745,390 B2
(45) Date of Patent: Sep. 22, 2026

(54) SEMICONDUCTOR MEMORY DEVICE

(71) Applicant: KIOXIA CORPORATION, Tokyo (JP)

(72) Inventor: Yoichi Minemura, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 1154 days.

(21) Appl. No.: 17/684,076

(22) Filed: Mar. 1, 2022

(65) Prior Publication Data

US 2023/0065666 A1 Mar. 2, 2023

(30) Foreign Application Priority Data

Aug. 27, 2021 (JP) ................................ 2021-138871

(51) Int. Cl.

*H10B 41/23* (2023.01)
*H10B 41/10* (2023.01)
*H10B 41/27* (2023.01)
*H10B 43/10* (2023.01)
*H10B 43/27* (2023.01)

(52) U.S. Cl.

CPC ............. *H10B 43/27* (2023.02); *H10B 41/10* (2023.02); *H10B 41/27* (2023.02); *H10B 43/10* (2023.02)

(58) Field of Classification Search

CPC ........ H10B 43/27; H10B 41/10; H10B 41/27; H10B 43/10; H10B 43/40; H10B 43/50; H10B 80/00; H10D 64/037

See application file for complete search history.

(56) References Cited

U.S. PATENT DOCUMENTS 10,896,732 B2 1/2021 Yagi
2010/0019310 A1 1/2010 Sakamoto
2012/0091521 A1 4/2012 Goda
2014/0367758 A1 12/2014 Izumida et al.
2015/0263036 A1 9/2015 Yasuda et al.
2017/0186765 A1* 6/2017 Koval .................... G11C 16/26
2017/0256316 A1 9/2017 Maejima
2018/0076208 A1 3/2018 Sakuma (Continued)

FOREIGN PATENT DOCUMENTS

CN 110289259 A 9/2019
CN 110875330 A 3/2020

(Continued)

OTHER PUBLICATIONS

Chinese Office Action dated Jan. 20, 2026, mailed in counterpart Chinese Application No. 202210172864.6, 25 pages.

*Primary Examiner* — Samuel Park
(74) *Attorney, Agent, or Firm* — Kim & Stewart LLP

(57) ABSTRACT

According to one embodiment, a semiconductor memory device includes first conductive layers stacked on a substrate at a first pitch, second conductive layers stacked on the substrate at a second pitch, and third conductive layers stacked on the substrate at a third pitch. The third conductive layers are between the substrate and the second conductive layers in a first direction. A semiconductor layer extends in the first direction through the first conductive layers, the second conductive layers, and the third conductive layers. The semiconductor layer has a first portion facing the first conductive layers and the second conductive layers and a second portion facing the third conductive layers. The second pitch is greater than the first pitch and the third pitch.

20 Claims, 26 Drawing Sheets

(56) References Cited

U.S. PATENT DOCUMENTS

| | | | | |
|---|---|---|---|---|
| 2019/0198521 | A1 | 6/2019 | Komiya | |
| 2020/0251490 | A1* | 8/2020 | Matsumoto | H01L 23/5226 |
| 2020/0279859 | A1* | 9/2020 | Uchida | H10B 43/40 |
| 2021/0091094 | A1 | 3/2021 | Kikushima | |
| 2021/0233872 | A1 | 7/2021 | Wakatsuki | |
| 2021/0233895 | A1 | 7/2021 | Yamaoka | |
| 2021/0249434 | A1 | 8/2021 | Nishikawa | |
| 2021/0257383 | A1 | 8/2021 | Ochi | |

FOREIGN PATENT DOCUMENTS

| | | | |
|---|---|---|---|
| JP | 2010034112 | A | 2/2010 |
| JP | 2014241358 | A | 12/2014 |
| JP | 2015177013 | A | 10/2015 |
| JP | 6581019 | B2 | 9/2019 |
| TW | 201813057 | A | 4/2018 |
| TW | 202114178 | A | 4/2021 |
| TW | 202131491 | A | 8/2021 |
| TW | 202131492 | A | 8/2021 |

* cited by examiner

ST
CC
121
BL
Vy
Ch
BLK
Z
Y
X
$L_{MCA}$
$L_{TR}$
100
D0, D1, D2
CS
gc
Tr
130
125
120
110
101
111
113
112
114
GC
$L_{MCA2}$
$L_{MCA1}$

SEMICONDUCTOR MEMORY DEVICE

CROSS-REFERENCE TO RELATED APPLICATION(S)

This application is based upon and claims the benefit of priority from Japanese Patent Application No. 2021-138871, filed Aug. 27, 2021, the entire contents of which are incorporated herein by reference.

FIELD

Embodiments described herein relate generally to a semiconductor memory device.

BACKGROUND

A semiconductor memory device of a certain type includes a substrate with a plurality of first conductive layers arranged along a first direction intersecting the surface of the substrate. A semiconductor layer extends in the first direction and faces the first conductive layers.

BRIEF DESCRIPTION OF THE DRAWINGS

FIGS. 7 to 20 are schematic cross-sectional views illustrating aspects related to a method for manufacturing a semiconductor memory device according to a first embodiment.

DETAILED DESCRIPTION

Figure 1:
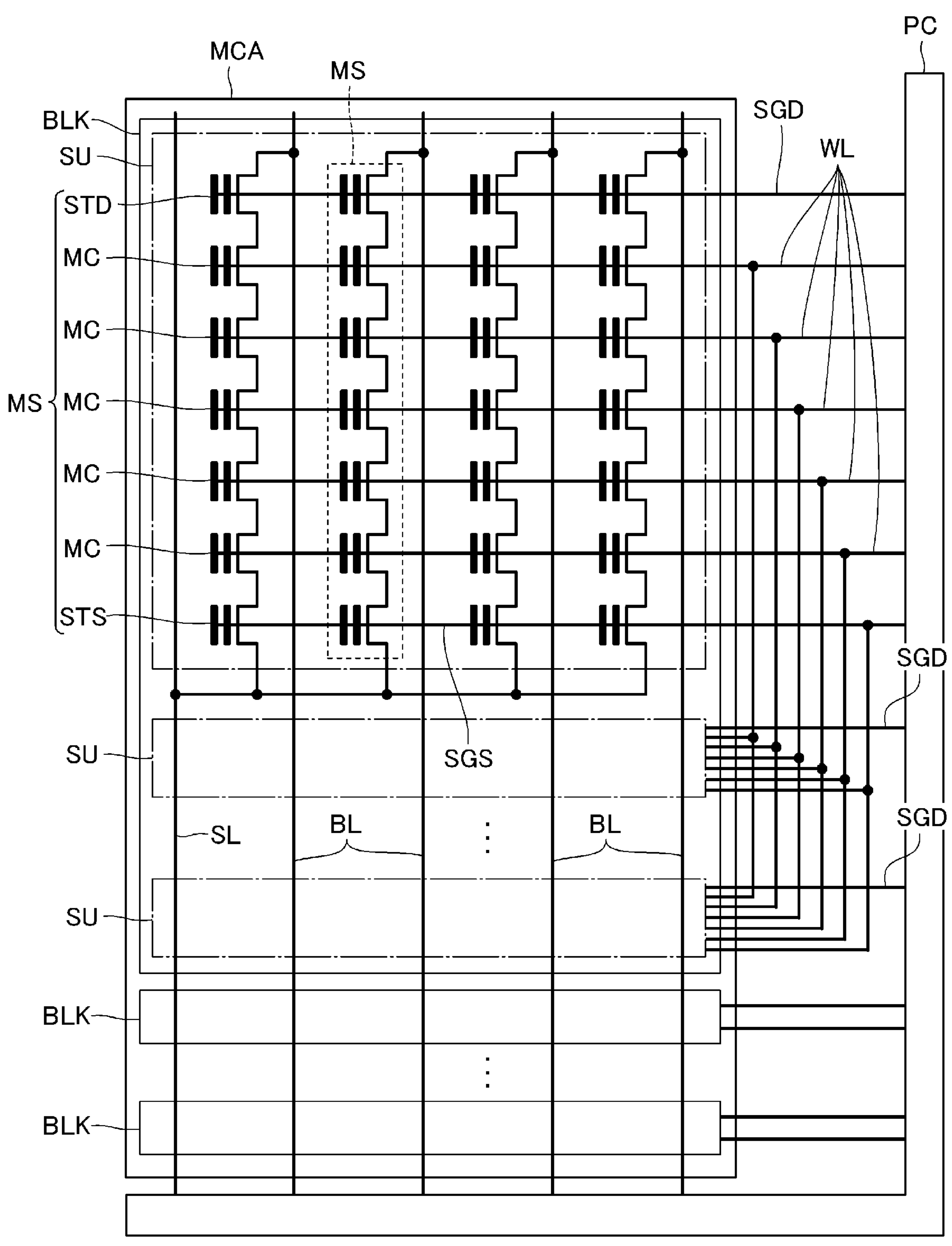
FIG. 1 is a schematic diagram of a portion of a semiconductor memory device according to a first embodiment.

In general, according to one embodiment, a semiconductor memory device includes a plurality of first conductive layers stacked on a substrate along a first direction at a first pitch, a plurality of second conductive layers stacked on the substrate along the first direction at a second pitch, and a plurality of third conductive layers stacked on the substrate along the first direction at a third pitch. The plurality of second conductive layers is between the substrate and the plurality of first conductive layers in the first direction. The plurality of third conductive layers is between the substrate and the plurality of second conductive layers in the first direction. A semiconductor layer (also referred to as a memory pillar) extends in the first direction through the first conductive layers, the second conductive layers, and the third conductive layers. The semiconductor layer has a first portion facing the first conductive layers and the second conductive layers and a second portion facing the third conductive layers. The second pitch is greater than the first pitch and the third pitch.

Semiconductor memory devices according to certain example embodiments will be described with reference to the drawings. These particular embodiments are merely examples, the scope of the present disclosure is not limited thereto. The drawings are schematic, and some components or elements may be omitted for convenience of illustration. The same reference symbols are used for component or elements which are common to embodiments, and a duplicate description thereof may be omitted.

As used herein, a "semiconductor memory device" may refer to a memory die or to a memory system including a controller die, such as a memory chip, a memory card or an SSD (Solid State Drive). A "semiconductor memory device" may also refer to a host computer incorporating a memory die or memory system, such as a smartphone, a tablet terminal or a personal computer.

As used herein, terms such as "above", "upper", "below", "lower", etc. refer to relative positional relationships between components being described. In general, the direction going increasing away from a substrate (e.g., semiconductor substrate 100) along the Z direction is referred to as an upward direction, while the direction getting closer to the substrate along the Z direction is referred to as a downward direction. The lower surface or end of a structure refers to the substrate-side surface or substrate-side end of the structure, while the upper surface or end of the structure refers to the opposite surface or end of the structure facing away from the substrate. A "side surface" refers to a surface intersecting the X direction or the Y direction.

As used herein, the dimensional terms "width", "length", "thickness", etc. as related to a structure, a member, a component, or the like may refer to the measured width, length, thickness, etc. as observed in a device cross-section by SEM (Scanning Electron Microscopy) or TEM (Transmission Electron Microscopy).

First Embodiment

FIG. 1 is a schematic circuit diagram showing the construction of a portion of a semiconductor memory device according to a first embodiment. The semiconductor memory device according to the first embodiment includes a memory cell array MCA, and a peripheral circuit PC.

The memory cell array MCA includes a plurality of memory blocks BLK. The memory blocks BLK each include a plurality of string units SU. The string units SU each include a plurality of memory strings MS. One end of each memory string MS is connected to the peripheral circuit PC via a bit line BL. The other end of each memory string MS is connected to the peripheral circuit PC via a common source line SL.

Each memory string MS includes a drain-side select transistor STD, a plurality of memory cells MC (memory transistors), and a source-side select transistor STS. The drain-side select transistor STD, the memory cells MC, and the source-side select transistor STS are connected in series between the bit line BL and the source line SL. The drain-side select transistor STD and the source-side select transistor STS may sometimes be referred to simply as the select transistors (STD, STS).

The memory cell MC is a field-effect transistor. The memory cell MC includes a semiconductor layer, a gate insulating film, and a gate electrode. The semiconductor layer functions as a channel region. The gate insulating film includes a charge storage film. The threshold voltage of the memory cell MC varies with the charge amount in the charge storage film. The memory cell MC stores one-bit or multi-bit data. A word line WL is connected to each of the gate electrodes of memory cells MC corresponding to one memory string MS. The word lines WL are each connected to all the memory strings MS in one memory block BLK.

The select transistors (STD, STS) are each a field-effect transistor. The select transistors (STD, STS) each include a semiconductor layer, a gate insulating film, and a gate electrode. The semiconductor layer functions as a channel region. Select gate lines (SGD, SGS) are connected to the gate electrodes of the select transistors (STD, STS), respectively. One drain-side select gate line SGD is connected, in common, to all the memory strings MS in one string unit SU. One source-side select gate line SGS is connected, in common, to all the memory strings MS in one memory block BLK.

The peripheral circuit PC includes, for example, a voltage generation circuit for generating an operating voltage, a voltage transfer circuit for transferring the operating voltage generated to a selected bit line BL, a selected word line WL, a selected source line SL, selected select gate lines (SGD, SGS), etc., a sense amplifier module connected to bit lines BL, and a sequencer for controlling these components.

Figure 2:
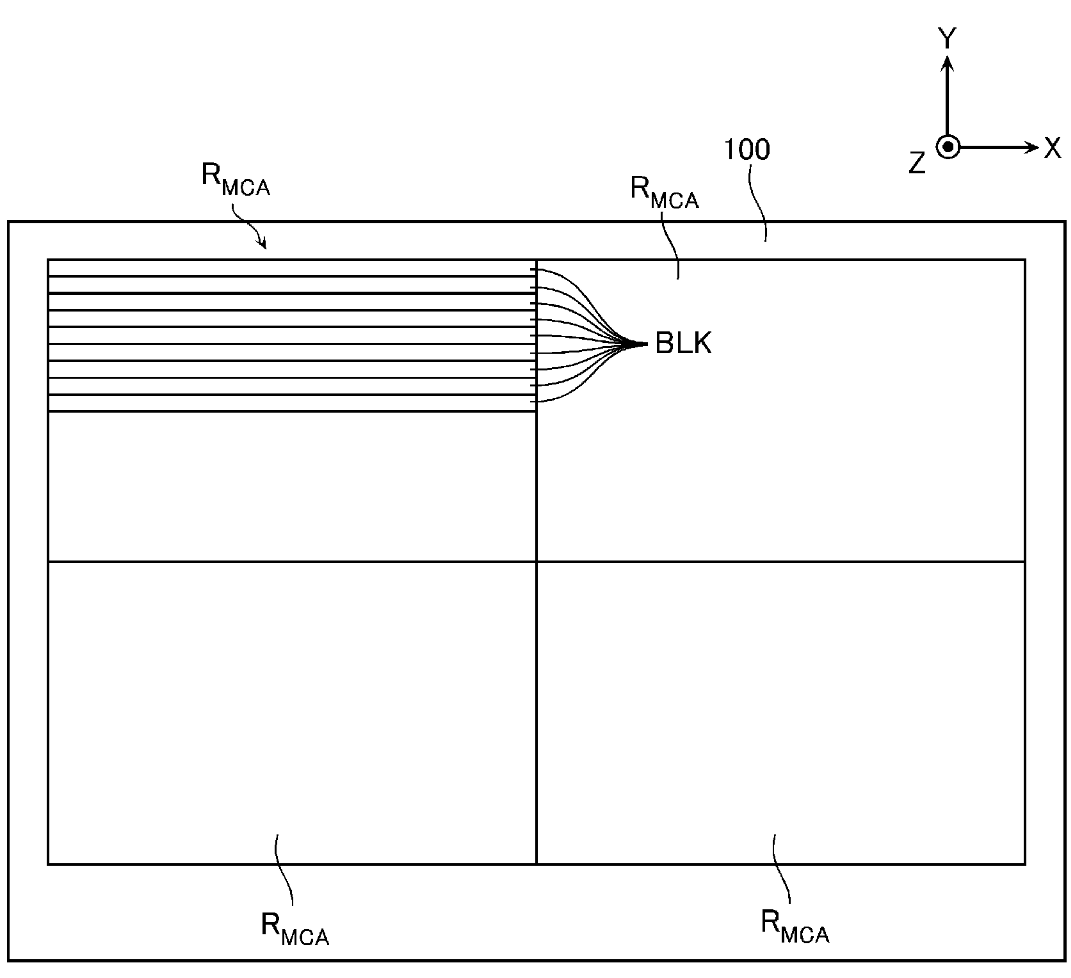
FIG. 2 is a schematic plan view of a portion of a semiconductor memory device according to a first embodiment.

FIG. 2 is a schematic plan view showing the construction of a portion of the semiconductor memory device according to the first embodiment. The semiconductor memory device according to this embodiment includes a semiconductor substrate 100. The semiconductor substrate 100 is, for example, a semiconductor substrate made of P-type silicon (Si) containing a P-type impurity such as boron (B). In the illustrated embodiment, the semiconductor substrate 100 has four memory cell array regions $R_{MCA}$ arranged in the X and Y directions. Each memory cell array region $R_{MCA}$ has a plurality of memory blocks BLK arranged in the Y direction.

Figure 3:
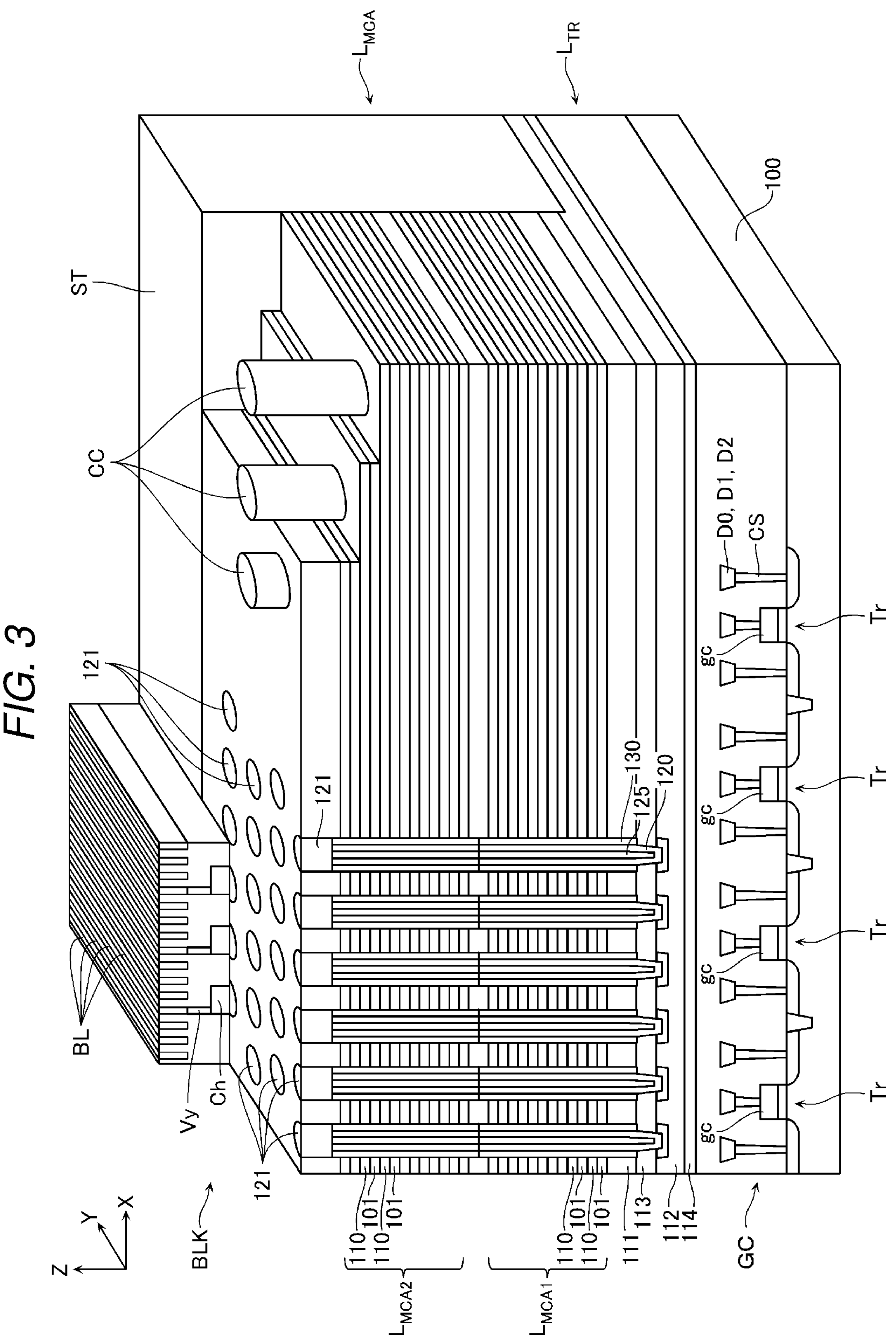
FIG. 3 is a schematic perspective view of a portion of a semiconductor memory device according to a first embodiment.
Figure 4:
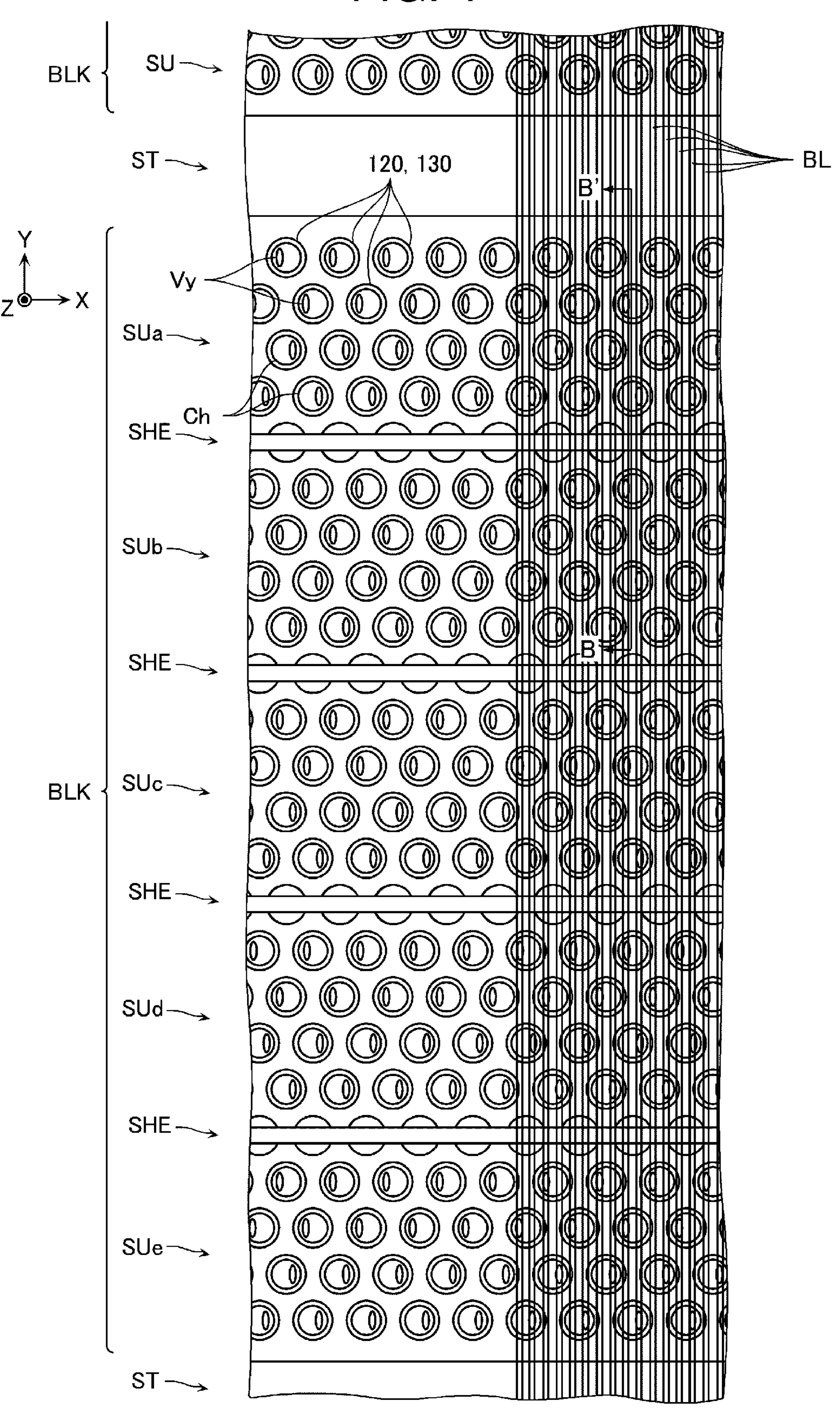
FIG. 4 is a schematic plan view of a portion of a semiconductor memory device according to a first embodiment.
Figure 5:
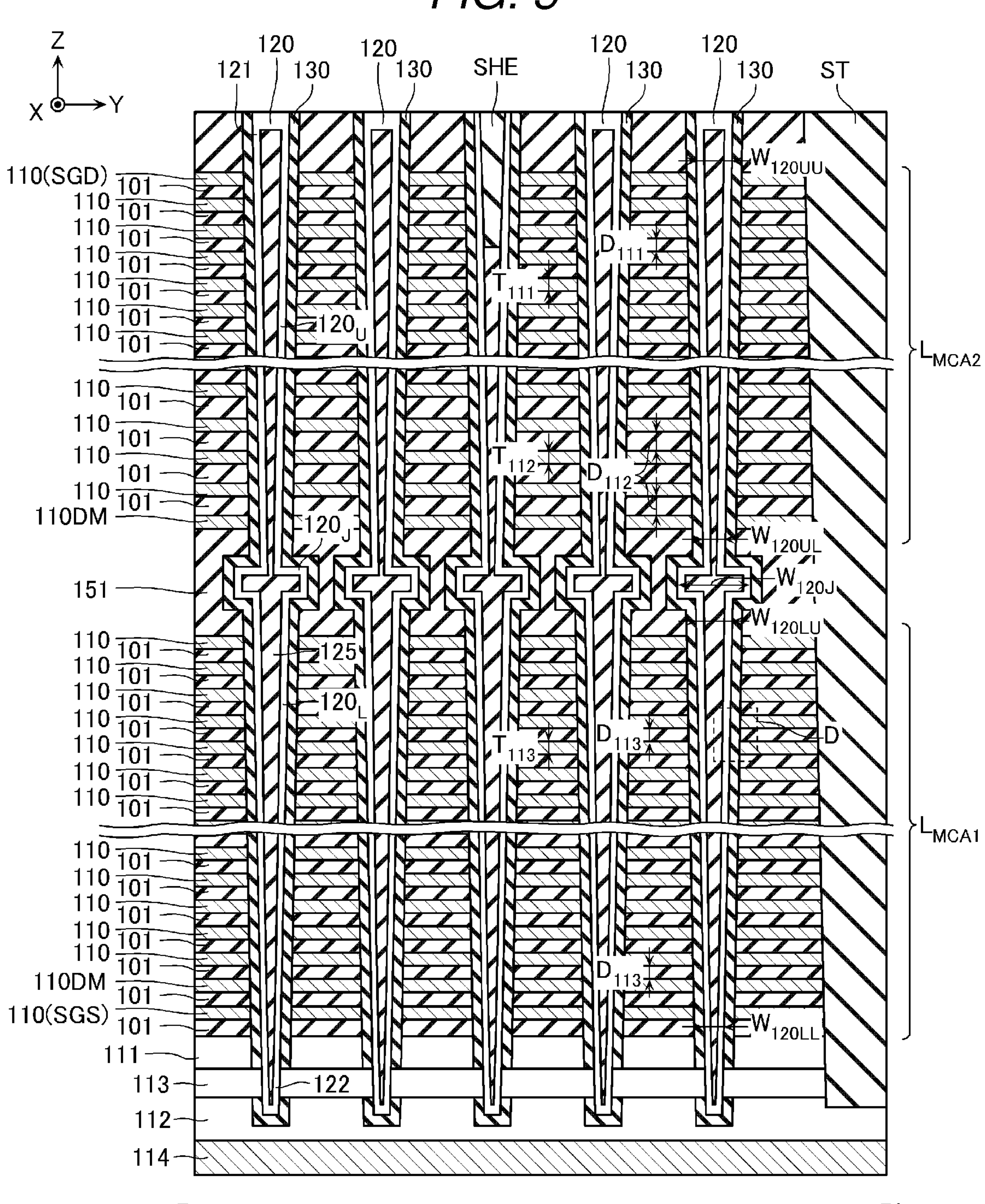
FIG. 5 is a schematic cross-sectional view of a portion of a semiconductor memory device according to a first embodiment.
Figure 6:
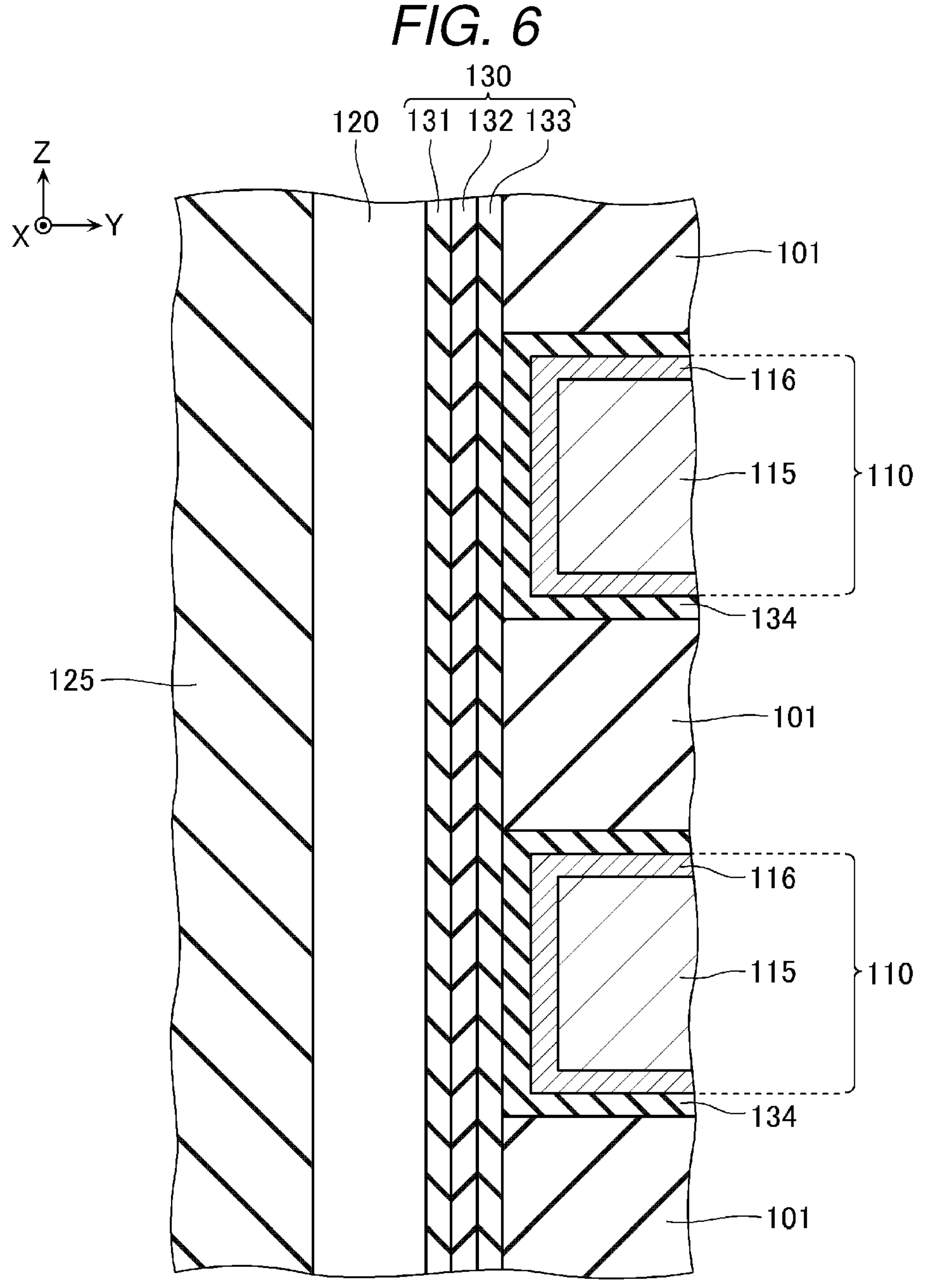
FIG. 6 is a schematic cross-sectional view of a portion of a semiconductor memory device according to a first embodiment.

FIG. 3 is a schematic perspective view showing the construction of a portion of the semiconductor memory device according to the first embodiment. FIG. 4 is a schematic plan view showing the construction of a portion of the semiconductor memory device according to the first embodiment. FIG. 5 is a schematic cross-sectional view of the structure shown in FIG. 4, cut along the line B-B' and as viewed along the direction of the arrows. FIG. 6 is a schematic enlarged cross-sectional view of the region D shown in FIG. 5.

As shown in FIG. 3, the semiconductor memory device of this first embodiment includes a transistor layer $L_{TR}$ provided on the semiconductor substrate 100, and a memory cell array layer $L_{MCA}$ provided above the transistor layer $L_{TR}$.

Structure of Transistor Layer $L_{TR}$

As shown in FIG. 3, an interconnect layer GC is provided on the upper surface of the semiconductor substrate 100 within an insulating layer. The interconnect layer GC includes a plurality of electrodes gc facing the surface of the semiconductor substrate 100. Various areas of the semiconductor substrate 100 and the electrodes gc in the interconnect layer GC are each connected to different contacts CS.

The electrodes gc and function as gate electrodes of transistors Tr, electrodes of capacitors, etc. constituting the peripheral circuit PC.

Each contact CS extends in the Z direction, and is connected at the lower end to the semiconductor substrate 100 or the upper surface of the electrode gc. An impurity region containing an N-type impurity or a P-type impurity is provided in connecting portions between the contacts CS and the semiconductor substrate 100. Each contact CS may comprise, for example, a laminated film including a barrier conductive film such as a titanium nitride (TiN) film, and a metal film such as a tungsten (W) film.

Interconnects D0, D1, D2 in an interconnect layer such interconnects are electrically connected to at least one of a structure in the memory cell array MCA and a structure in the peripheral circuit PC. The interconnects may each comprise a laminated film including a barrier conductive film such as a titanium nitride (TiN) film, and a metal film such as a tungsten (W) film. There may be a plurality of interconnect layers (levels) between the memory cell array MCA and the peripheral circuit PC.

Structure of Memory Cell Array Layer $L_{MCA}$

As shown in FIG. 3, the memory blocks BLK are provided in the memory cell array layer $L_{M}$CA.

In FIG. 4, a memory block BLK includes five string units $SU_a$ to $SU_e$ arranged one after the other along the Y-direction. The string units $SU_a$ to $SU_e$ each correspond to the string unit SU described above with reference to FIG. 1. An inter-string unit insulating layer SHE made of, for example, silicon oxide ($SiO_2$) is provided between string units SU adjacent to each other in the Y direction. An inter-block structure ST is provided between memory blocks BLK adjacent to each other in the Y direction.

As shown in FIGS. 3 and 5, in the memory cell array layer $L_{MCA}$, the memory block BLK includes a memory cell array layer $L_{MCA1}$, and a memory cell array layer $L_{MCA2}$ provided above the memory cell array layer $L_{MCA1}$. The memory cell array layer $L_{MCA1}$ and the memory cell array layer $L_{MCA2}$ include a plurality of conductive layers 110 stacked in the Z direction. A plurality of semiconductor layers 120 extend in the Z direction through the plurality of conductive layers 110. A gate insulating film 130 is provided between each semiconductor layer 120 and the surrounding the conductive layers 110.

Each conductive layer 110 is a generally plate-like layer. As shown in FIG. 6, a conductive layer 110 may comprise a laminated film including a barrier conductive film 116, such as a titanium nitride (TiN) film, and a metal film 115, such as a tungsten (W) film. An insulating metal oxide film 134, such as an alumina (AlO) film, may be provided covering the outer periphery of the barrier conductive film 116. In some examples, conductive layer 110 may comprise polycrystalline silicon containing an impurity such as phosphorus (P) or boron (B). A contact CC (FIG. 3) is provided near the X-direction end of each conductive layer 110. Insulating layers 101 which may be silicon oxide ($SiO_2$) layers in some examples, are provided between the conductive layers 110 in the Z direction.

As shown in FIG. 5, a semiconductor layer 111, a semiconductor layer 113 and a semiconductor layer 112 are provided below the stacked conductive layers 110. An insulating layer 101 is between the stacked conductive layers 110 and the semiconductor layer 111. A gate insulating film 130 portion is provided between the semiconductor layer 111 and each semiconductor layer 120. Another gate insulating film 130 portion is between the semiconductor layer 112 and each semiconductor layer 120. The semiconductor layer 113 contacts each semiconductor layer 120.

The upper surface of the semiconductor layer 113 is connected to the semiconductor layer 111, while the lower surface of the semiconductor layer 113 is connected to the semiconductor layer 112. A conductive layer 114 may be provided on the lower surface of the semiconductor layer 112. The semiconductor layer 111, the semiconductor layer 113, the semiconductor layer 112 and the conductive layer 114 function as the source line SL (FIG. 1). The source line SL is, for example, common to all the memory blocks BLK in the memory cell array region $R_{MCA}$ (FIG. 2). The semiconductor layer 111, the semiconductor layer 113 and the semiconductor layer 112 each comprise, for example, polycrystalline silicon containing an impurity such as phosphorus (P) or boron (B). The conductive layer 114 may comprise, for example, a metal such as tungsten (W), tungsten silicide, or other conductive material.

The lowermost one of the conductive layers 110 provided in the memory cell array layer $L_{MCA1}$ functions as a gate electrode of the source-side select gate line SGS (FIG. 1) and the source-side select transistors STS (FIG. 1) connected thereto. Such a conductive layer 110 in one memory block BLK is electrically independent from that in any other memory block BLK.

One or more upper ones of the conductive layers 110 provided in the memory cell array layer $L_{MCA1}$ are provided as dummies (dummy layers). Such a conductive layer 110 is hereinafter referred to as a dummy conductive layer 110DM. The dummy conductive layer 110DM does not function as a select gate line (SGD, SGS) or a word line WL. A memory cell MC that records data is not formed between the dummy conductive layer 110DM and the semiconductor layer 120.

A plurality of conductive layers 110 above the lower dummy conductive layer (s) 110DM in the memory cell array layer $L_{MCA1}$ each function as a gate electrode and a word line WL (FIG. 1) for the memory cells MC (FIG. 1) connected thereto. A memory cell MC that is used for a data recording operation is provided between these conductive layers 110 and the semiconductor layers 120. Such conductive layers 110 in one memory block BLK are electrically independent from those in any other memory block BLK.

The lowermost one of the conductive layers 110 provided in the memory cell array layer $L_{MCA2}$ is used as a dummy conductive layer 110DM. In some examples, a plurality of lowermost ones of the conductive layers 110 provided in the memory cell array layer $L_{MCA2}$ may be used as dummy conductive layers 110DM A plurality of the conductive layers 110 above the lower dummy conductive layer(s) 110DM provided in the memory cell array layer $L_{MCA2}$ each function as a gate electrode and a word line WL (FIG. 1) for the memory cells MC (FIG. 1) connected thereto. A memory cell MC that is used for a data recording operation is provided between these conductive layers 110 and the semiconductor layers 120. Such conductive layers 110 in one memory block BLK are electrically independent from those in any other memory block BLK.

At least one of the conductive layers 110 above conductive layers 110 used as word lines WL in the memory cell array layer $L_{MCA2}$ is used as the drain-side select gate line SGD (FIG. 1) for the drain-side select transistors STD (FIG. 1) connected thereto. Such a conductive layer(s) 110 has a smaller Y-direction width than the other conductive layers 110.

An inter-string unit insulating layer SHE is provided between conductive layers 110 adjacent to each other in the Y direction. The conductive layers 110 in one string unit SU are electrically independent from those in any other string unit SU.

As shown in FIGS. 3 and 4, semiconductor layers 120 are arranged in a predetermined pattern in the X and Y directions. Each semiconductor layer 120 functions as a channel region of the memory cells MC and the select transistors (STD, STS) included in one memory string MS (FIG. 1). The semiconductor layer 120 is, for example, polycrystalline silicon (Si). As shown in FIG. 3, the semiconductor layer 120 has a generally cylindrical shape with an open top end and closed bottom end. A central insulating layer 125 made of, for example, silicon oxide is disposed within the interior shape formed by the semiconductor layer 120. The semiconductor layers 120 may be referred to as pillars, columns, memory pillars, or the like in some contexts.

As shown in FIG. 5, each semiconductor layer 120 has a semiconductor region $\mathbf{120}_L$ in the memory cell array layer $L_{MCA1}$ and a semiconductor region $\mathbf{120}_U$ in the memory cell array layer $L_{MCA2}$. The semiconductor layer 120 also has a semiconductor region $\mathbf{120}_J$ connecting the upper end of the semiconductor region $\mathbf{120}_L$ and to the lower end of the semiconductor region $\mathbf{120}_U$, an impurity region 122 connected to the lower end of the semiconductor region $\mathbf{120}_L$, and an impurity region 121 connected to the upper end of the semiconductor region $\mathbf{120}_U$.

The semiconductor region $\mathbf{120}_L$ is a generally cylindrical region extending in the Z direction. The outer peripheral surface of the semiconductor region $\mathbf{120}_L$ faces the conductive layers 110 included in the memory cell array layer $L_{MCA1}$.

The semiconductor region $\mathbf{120}_U$ is a generally cylindrical region extending in the Z direction. The outer peripheral surface of the semiconductor region $\mathbf{120}_U$ faces the conductive layers 110 included in the memory cell array layer $L_{MCA2}$.

The semiconductor region $\mathbf{120}_J$ is provided above the conductive layers 110 included in the memory cell array layer $L_{MCA1}$ but below the conductive layers 110 included in the memory cell array layer $L_{MCA2}$.

The impurity region 122 is connected to the semiconductor layer 113. The impurity region 122 contains an impurity, for example, an N-type impurity such as phosphorus (P) or a P-type impurity such as boron (B). A portion of the semiconductor layer 120 located just above the impurity region 122 functions as a channel region of the source-side select transistor STS.

The impurity region 121 contains an impurity, for example, an N-type impurity such as phosphorus (P). The impurity region 121 is connected to a bit line BL via a contact Ch and a contact Vy (FIG. 3).

The gate insulating film 130 covers the peripheral surface of the semiconductor layer 120 and has a closed bottomed, generally cylindrical shape. As shown in FIG. 6, the gate insulating film 130 includes, for example, a tunnel insulating film 131, a charge storage film 132 and a block insulating film 133 which are stacked between the semiconductor layer 120 and the conductive layers 110. The insulating film 131 and the block insulating film 133 are, for example, insulating films of silicon oxide ($SiO_2$). The charge storage film 132 is a film made of, for example, silicon nitride ($Si_3N_4$) and capable of storing charges. The tunnel insulating film 131, the charge storage film 132 and the block insulating film 133 each have a generally cylindrical shape and extend in the Z direction along the outer peripheral surface of the semiconductor layer 120.

The gate insulating film 130 may include a floating gate made of, for example, polycrystalline silicon containing an N-type or P-type impurity.

The inter-block structure ST is a structure which extends in the Z and X directions, divides the insulating layers 101, the conductive layers 110, the semiconductor layer 111, and the semiconductor layer 113 in the Y direction, and reaches the semiconductor layer 112. The inter-block structure ST is, for example, an insulating layer such as a silicon oxide ($SiO_2$) layer. The inter-block structure ST may include, at the center in the Y direction, a conductive layer made of, for example, tungsten and extending in the X and Z directions. The lower end of the conductive layer may be connected to the semiconductor layer 112.

Radial Widths of Semiconductor Regions $\mathbf{120}_L$, $\mathbf{120}_U$, $\mathbf{120}_J$ The radial dimensions of the semiconductor regions $\mathbf{120}_L$, $\mathbf{120}_U$, $\mathbf{120}_J$ will be described. As used herein, a "radial width" refers to the dimension in an X-Y plane of a generally cylindrical component/element having an axial dimension along the Z direction regions $\mathbf{120}_L$, $\mathbf{120}_U$ extend. For convenience of illustration, the Y-direction width is depicted and taken as the radial width in FIG. 5 of the semiconductor regions $\mathbf{120}_L$, $\mathbf{120}_U$, $\mathbf{120}_J$.

The radial width $W_{120LL}$ at the lower end (a portion located below the conductive layers 110 included in the memory cell array layer $L_{MCA1}$) of the semiconductor region $\mathbf{120}_L$ is smaller than the radial width $W_{120LU}$ of the upper end (a portion located above the conductive layers 110 included in the memory cell array layer $L_{MCA1}$) of the semiconductor region $\mathbf{120}_L$. The semiconductor region $\mathbf{120}_L$ is formed such that the radial width tapers or narrows as the position gets nearer to the substrate 100.

The radial width $W_{120UL}$ of the lower end (a portion located below the conductive layers 110 included in the memory cell array layer $L_{MCA2}$) of the semiconductor region $\mathbf{120}_U$ is smaller than the radial width $W_{120UU}$ of the upper end (a portion located above the conductive layers 110 included in the memory cell array layer $L_{MCA2}$) of the semiconductor region $\mathbf{120}_U$. The semiconductor region $\mathbf{120}_U$ is formed such that the radial width tapers or narrows as the position get nearer to the substrate 100 (and to the semiconductor region $\mathbf{120}_J$). The radial width of the semiconductor region $\mathbf{120}_U$ is smallest for the portion just above the semiconductor region $\mathbf{120}_J$.

The radial width $W_{120J}$ of the semiconductor region $\mathbf{120}_J$ is larger than any of the radial widths $W_{120LL}$, $W_{120LU}$, $W_{120UL}$ and $W_{120UU}$ of the semiconductor regions $\mathbf{120}_L$, $\mathbf{120}_U$.

Pitch of Conductive Layers 110

The pitch of the conductive layers 110 in the Z direction will be described. As used herein, the term "pitch" refers to the distance between two conductive layers 110 adjacent to each other in the Z direction. In this case, the pitch may correspond to the thickness of the insulating layer 101 provided between two conductive layers 110 adjacent to each other in the Z direction.

As shown in FIG. 5, relatively upper ones of the conductive layers 110 provided in the memory cell array layer $L_{MCA2}$ are arranged at a pitch $D_{111}$ in the Z direction. Relatively lower ones of the conductive layers 110 provided in the memory cell array layer $L_{MCA2}$ are arranged at a pitch $D_{112}$ in the Z direction. The dummy conductive layer 110DM and the conductive layer 110 immediately above are also arranged at the pitch $D_{112}$ in the Z direction. In the memory cell array layer $L_{MCA1}$, the conductive layers 110 are arranged at a pitch $D_{113}$ in the Z direction, and the dummy conductive layer 110DM and the conductive layer 110 immediately above are also arranged at the pitch $D_{113}$ in the Z direction. The pitch $D_{112}$ is larger than the pitch $D_{111}$ and the pitch $D_{113}$.

In such a structure, the thickness of individual insulating layers 101 in the region where the conductive layers 110 are arranged at the pitch $D_{112}$ is greater than the thickness of individual insulating layers 101 in the region where the conductive layers 110 are arranged at the pitch $D_{111}$ and also those in the region where the conductive layers 110 are arranged at the pitch $D_{113}$.

Thickness of Conductive Layer 110

In FIG. 5, the Z-direction thickness of each of the relatively upper ones of the conductive layers 110 provided in the memory cell array layer $L_{MCA2}$ is shown as a thickness $T_{111}$. The Z-direction thickness of each of the relatively lower ones of the conductive layers 110 provided in the memory cell array layer $L_{MCA2}$ is shown as a thickness $T_{112}$. The Z-direction thickness of each of the conductive layers 110 provided in the memory cell array layer $L_{MCA1}$ is shown as a thickness $T_{113}$. The thickness $T_{111}$, the thickness $T_{112}$ and the thickness $T_{113}$ are equal in this example.

Manufacturing Method

A method for manufacturing the semiconductor memory device according to the first embodiment will be described with reference to FIG. 7 through FIG. 20. FIGS. 7 through 20 are schematic cross-sectional views illustrating aspects of a manufacturing method, and show cross-sections corresponding in position to that depicted in FIG. 5.

In the manufacturing of the semiconductor memory device according to the first embodiment, a transistor layer $L_{TR}$ (FIG. 3) including a peripheral circuit PC (FIG. 1) is first formed on a semiconductor substrate 100.

Figure 7:
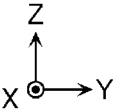
Figure 7:
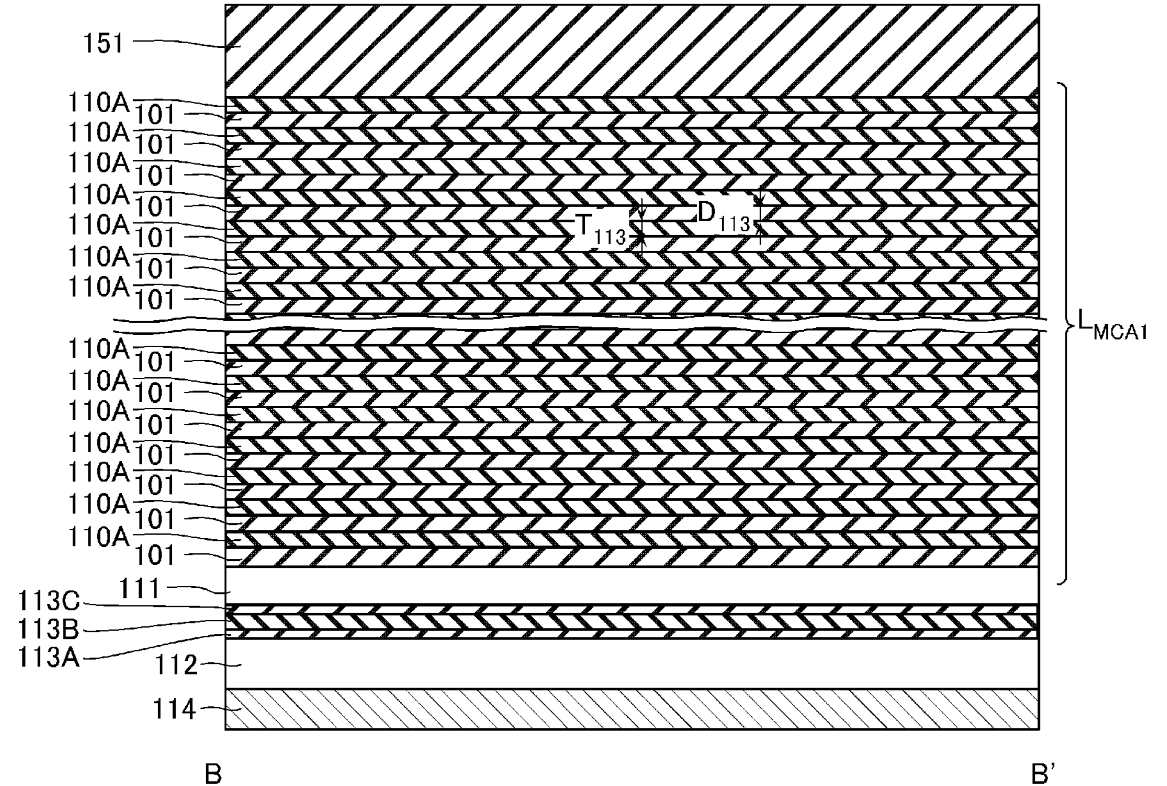

Next, as shown in FIG. 7, a conductive layer 114, a semiconductor layer 112, a sacrificial layer 113A such as a silicon oxide layer, a sacrificial layer 113B such as a silicon nitride layer, a sacrificial layer 113C such as a silicon oxide layer, and a semiconductor layer 111 are formed on the transistor layer $L_{TR}$. Subsequently, insulating layers 101 and sacrificial layers 110A are formed alternately, and then an insulating layer 151 such as a silicon oxide layer is formed. The insulating layers 101 are formed such that each layer has a thickness which is equal to the pitch $D_{113}$. The sacrificial layers 110A are formed such that each layer has a thickness which is equal to the thickness $T_{113}$. This step is performed, for example, by a method such as CVD (Chemical Vapor Deposition).

Figure 8:
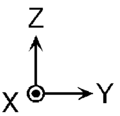
Figure 8:
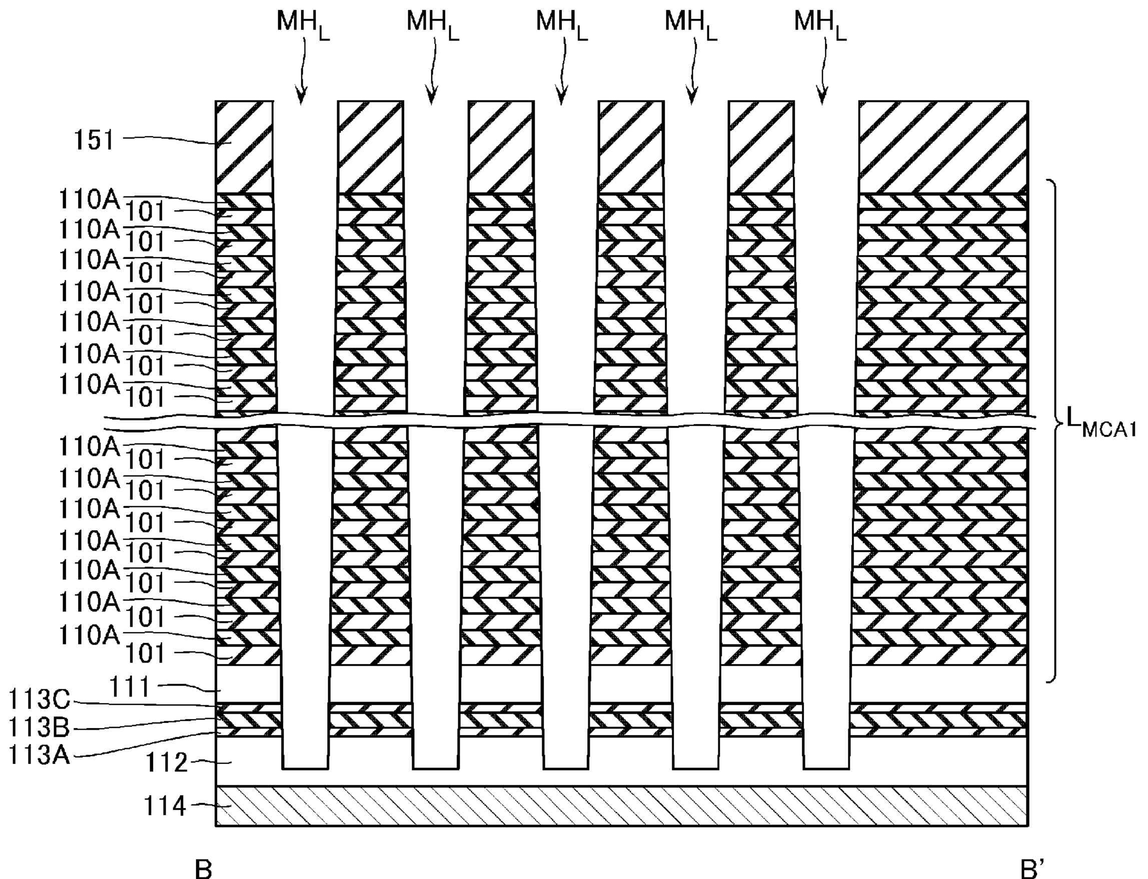

Next, as shown in FIG. 8, openings $MH_L$ are formed at positions corresponding to the semiconductor regions $\mathbf{120}_L$. The openings $MH_L$ extend in the Z direction, penetrate the insulating layer 151, the sacrificial layers 110A and the insulating layers 101, the semiconductor layer 111, the sacrificial layer 113C, the sacrificial layer 113B, and the sacrificial layer 113A, and expose the semiconductor layer 112. This step is performed, for example, by a method such as RIE (Reactive Ion Etching).

Figure 9:
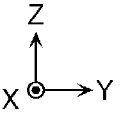
Figure 9:
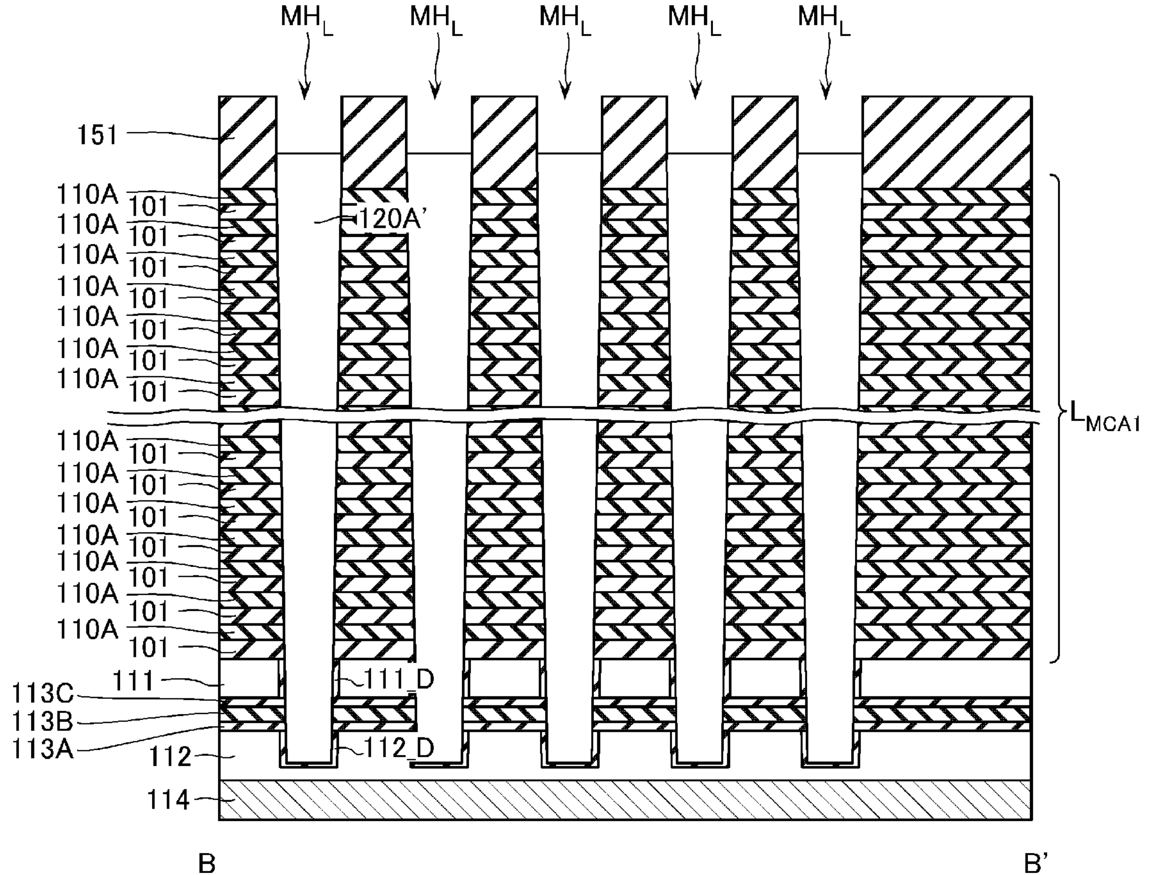

Next, as shown in FIG. 9, an insulating layer 111_D and an insulating layer 112_D, made of silicon oxide or the like, are formed in the semiconductor layer 111 and the semiconductor layer 112, respectively, in their portions exposed in the openings $MH_L$. This step is performed, for example, by thermal oxidation. Subsequently, a film of amorphous silicon is formed in the openings $MH_L$, and then the film is removed until its upper surface reaches a level intermediate between the upper surface and the lower surface of the insulating layer 151, thereby forming sacrificial layers 120A' in the openings $MH_L$. This step is performed, for example, by CVD and RIE.

Figure 10:
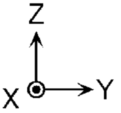
Figure 10:
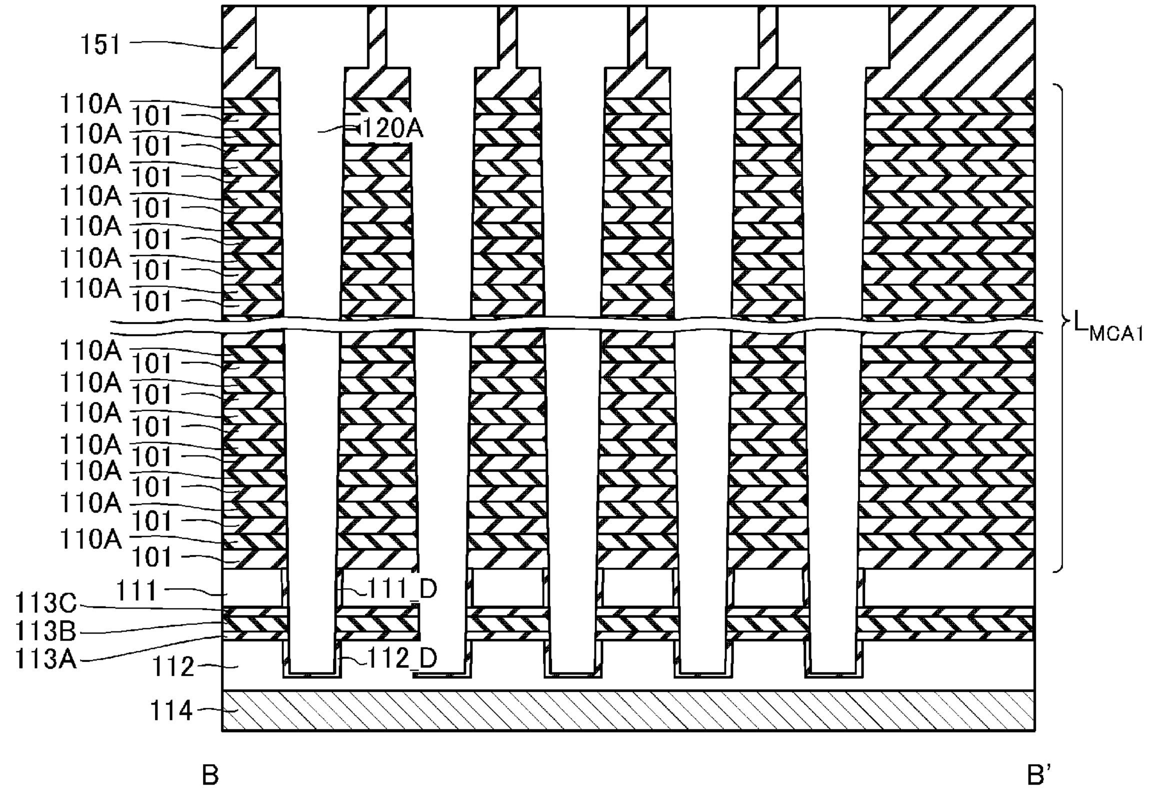

Next, as shown in FIG. 10, the top openings of the openings $MH_L$ are widened, and then a film of amorphous silicon is formed in and outside the top openings. Subsequently, the film is removed until its upper surface reaches the same level as the upper surface of the insulating layer 151, thereby forming sacrificial layers 120A. This step is performed, for example, by RIE and CVD.

Figure 11:
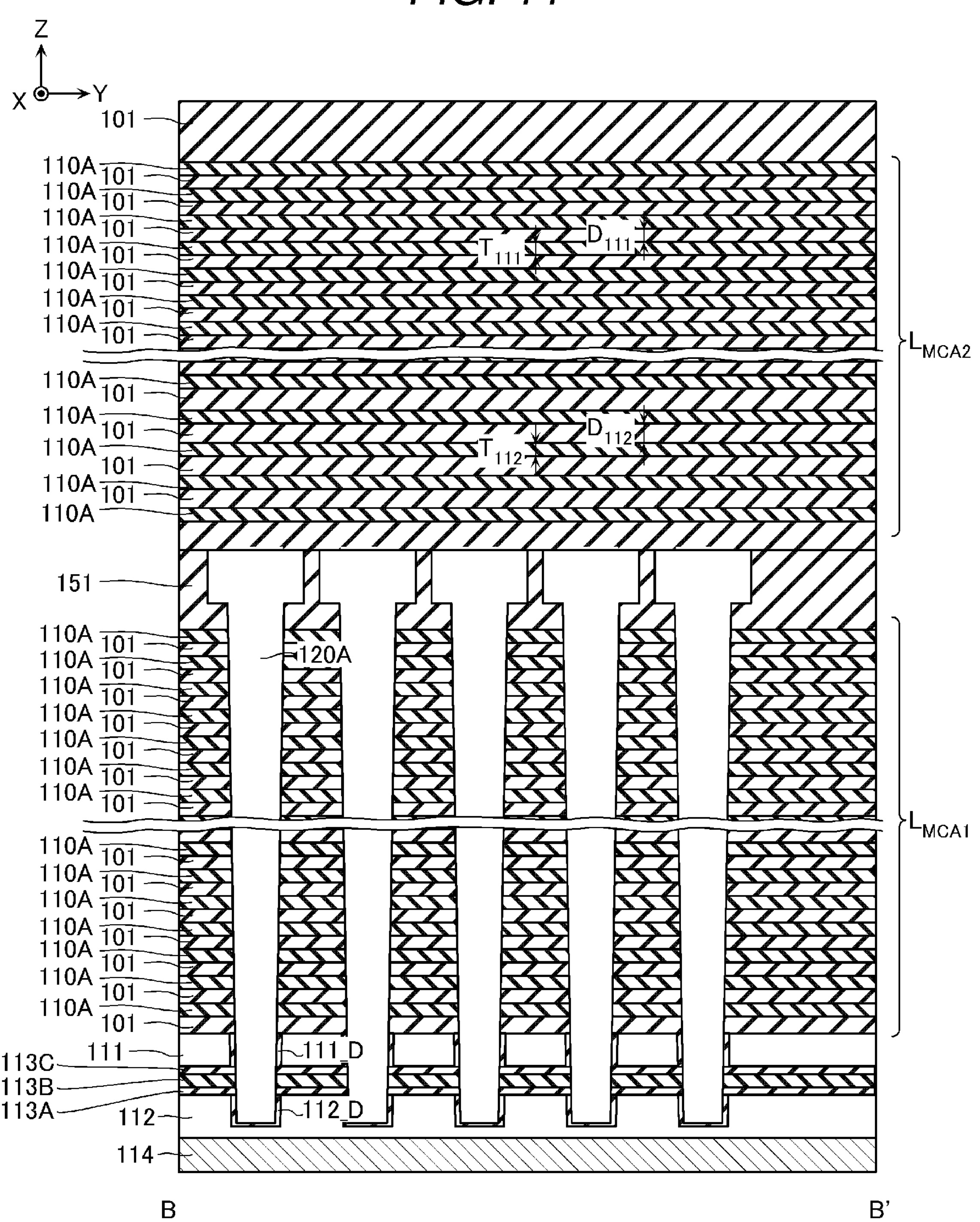

Next, as shown in FIG. 11, sacrificial layers 110A and insulating layers 101 are formed alternately on the insulating layer 151 (at a position corresponding to the memory cell array layer $L_{MCA2}$). Relatively lower ones of the insulating layers 101 are formed such that each layer has a thickness which is equal to the pitch $D_{112}$. Relatively upper ones of the insulating layers 101 are formed such that each layer has a thickness which is equal to the pitch $D_{111}$. Relatively lower ones of the sacrificial layers 110A are formed such that each layer has a thickness which is equal to the thickness $T_{112}$. Relatively upper ones of the sacrificial layers 110A are formed such that each layer has a thickness which is equal to the thickness $T_{111}$. This step is performed, for example, by a method such as CVD.

Figure 12:
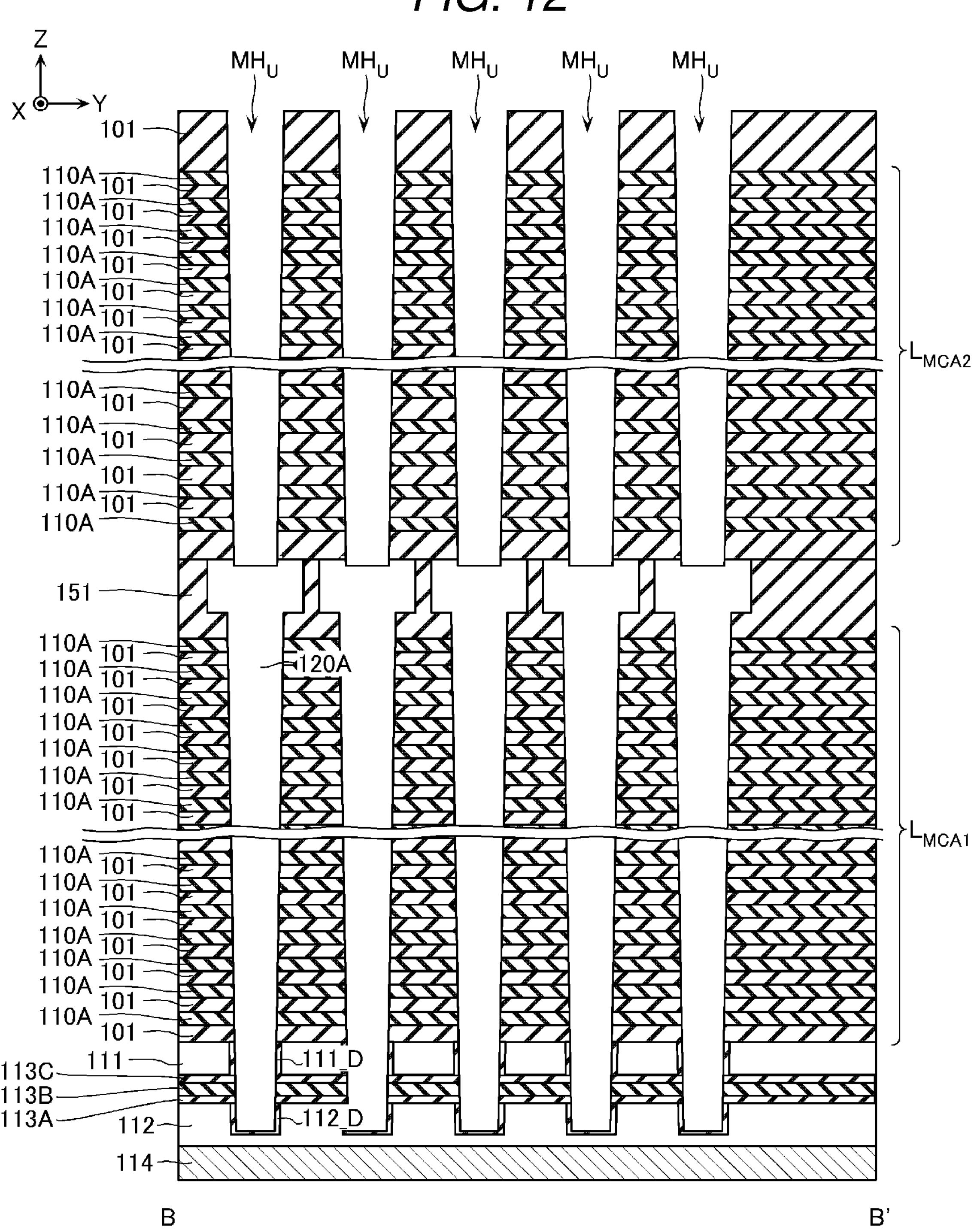

Next, as shown in FIG. 12, openings $MH_U$ are formed at positions corresponding to the semiconductor regions $\mathbf{120}_U$. The openings $MH_U$ extend in the Z direction, penetrate the sacrificial layers 110A and the insulating layers 101, and expose the sacrificial layers 120A. This step is performed, for example, by a method such as RIE.

Figure 13:
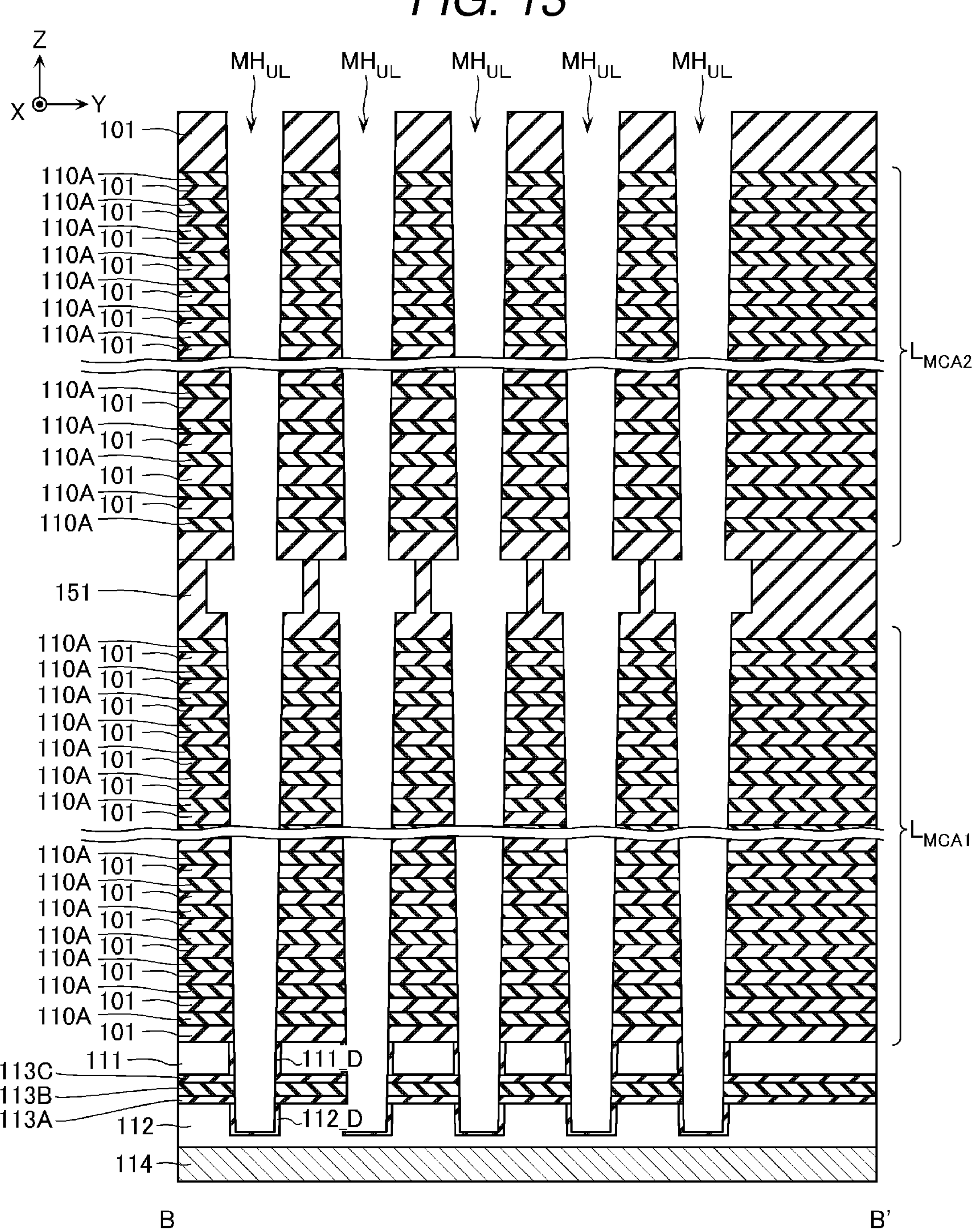

Next, as shown in FIG. 13, the sacrificial layers 120A are removed via the openings $MH_U$ to form openings $MH_{UL}$. In this step, the insulating layer 111_D and the insulating layer 112_D each serve as an etching stopper (etch stop layer); the semiconductor layer 111 and the semiconductor layer 112 are not etched at the same time. This step is performed, for example, by a method such as wet etching.

Figure 14:
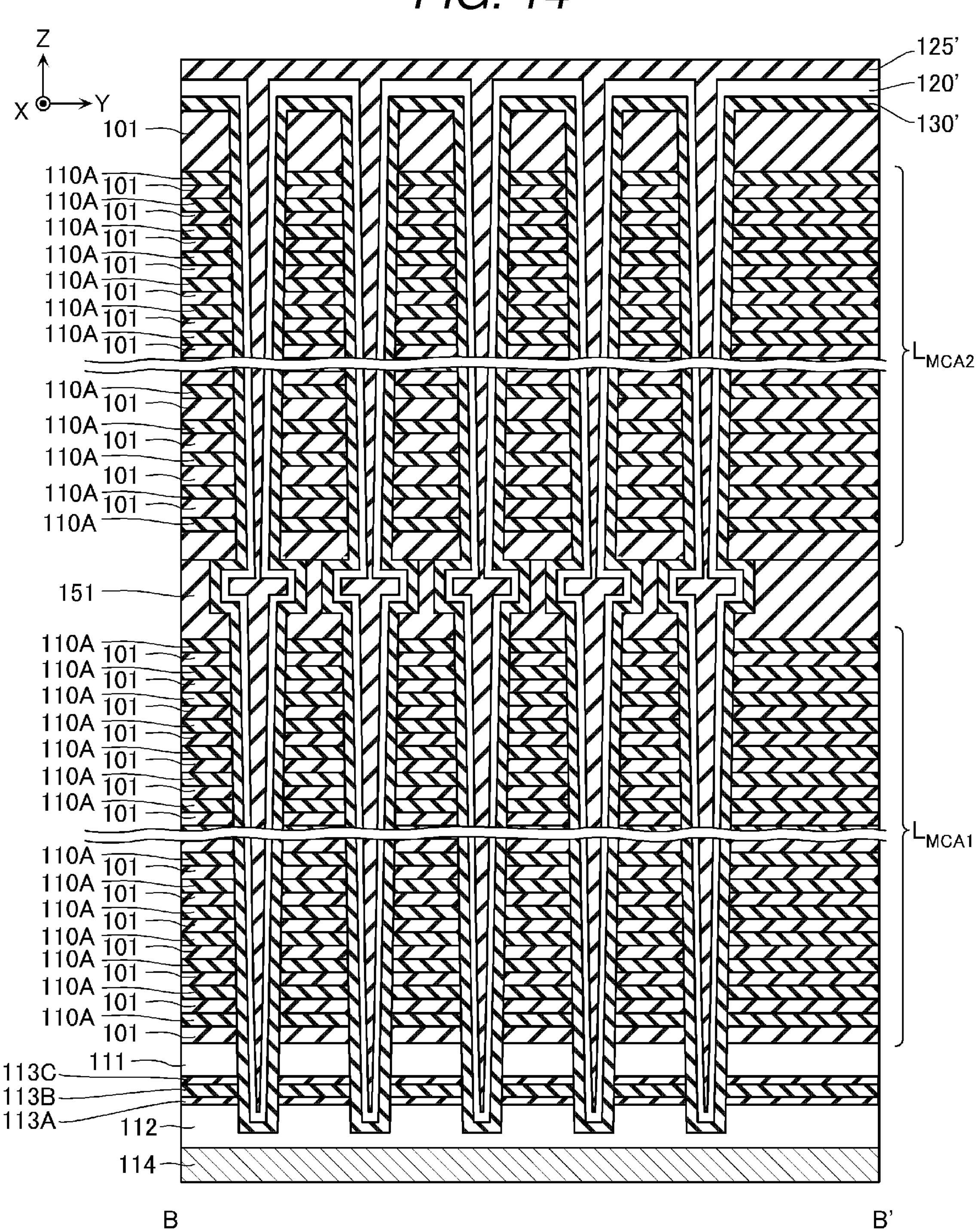

Next, as shown in FIG. 14, gate insulating films 130', each comprising the same laminated film as the gate insulating film 130, semiconductor layers 120' made of amorphous silicon, and an insulating layer 125' made of silicon oxide are formed on the upper surface of the topmost insulating layer 101 and on the inner peripheral surfaces of the openings $MH_{UL}$. This step is performed, for example, by a method such as CVD. The semiconductor layers 120' may be formed by first forming an amorphous silicon film by CVD, followed by annealing to modify the crystal structure of the amorphous silicon film.

Figure 15:
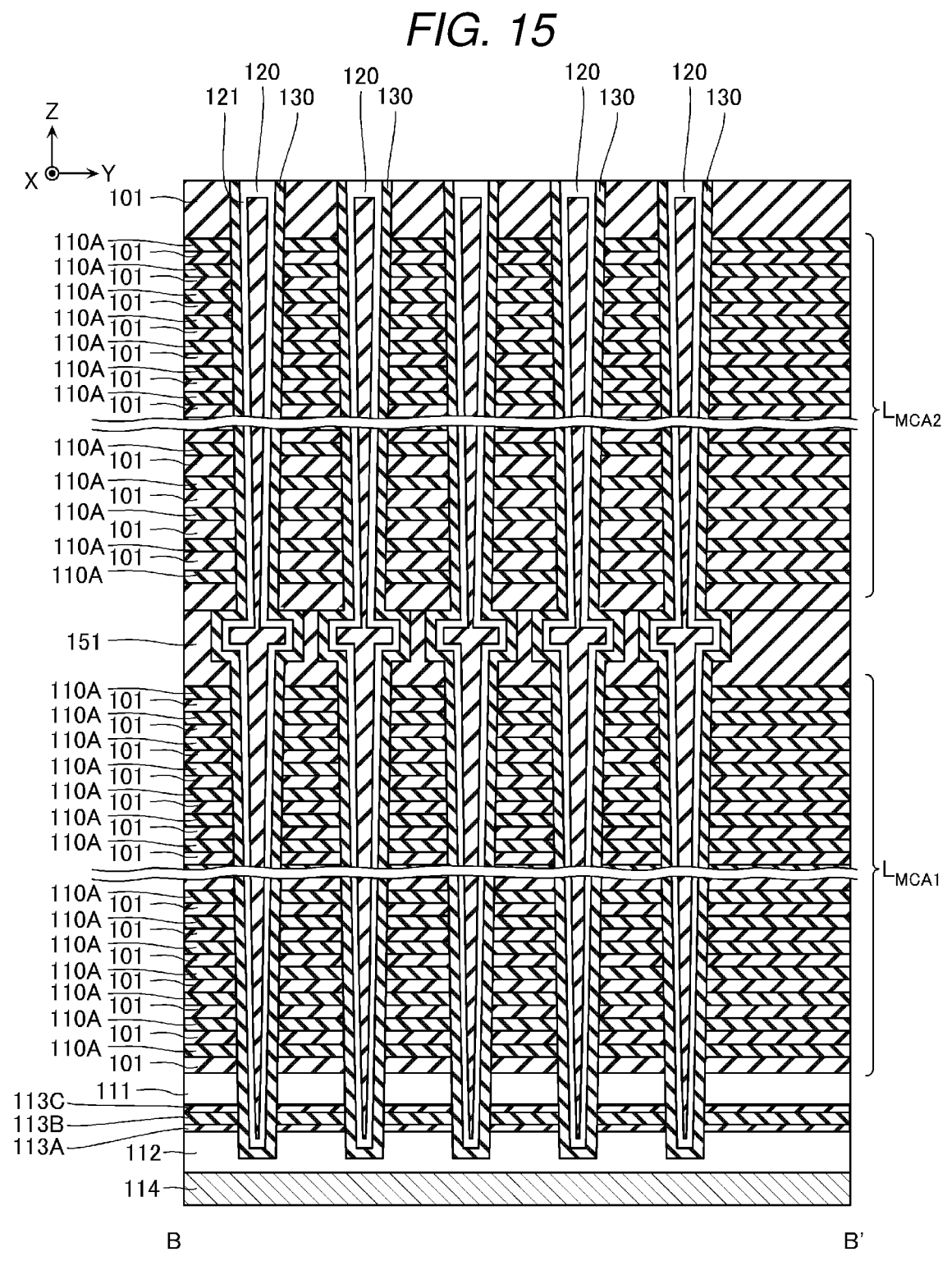

Next, as shown in FIG. 15, the insulating layer 125', the semiconductor layers 120' and the gate insulating films 130' are partly removed until their upper surfaces reach a level intermediate between the upper surface and the lower surface of the topmost insulating layer 101, thereby forming gate insulating films 130, semiconductor layers 120, and insulating layers 125. Subsequently, an impurity region 121 is formed in the vicinity of the upper end of each semiconductor layer 120. This step is performed, for example, by RIE and CVD.

Figure 16:
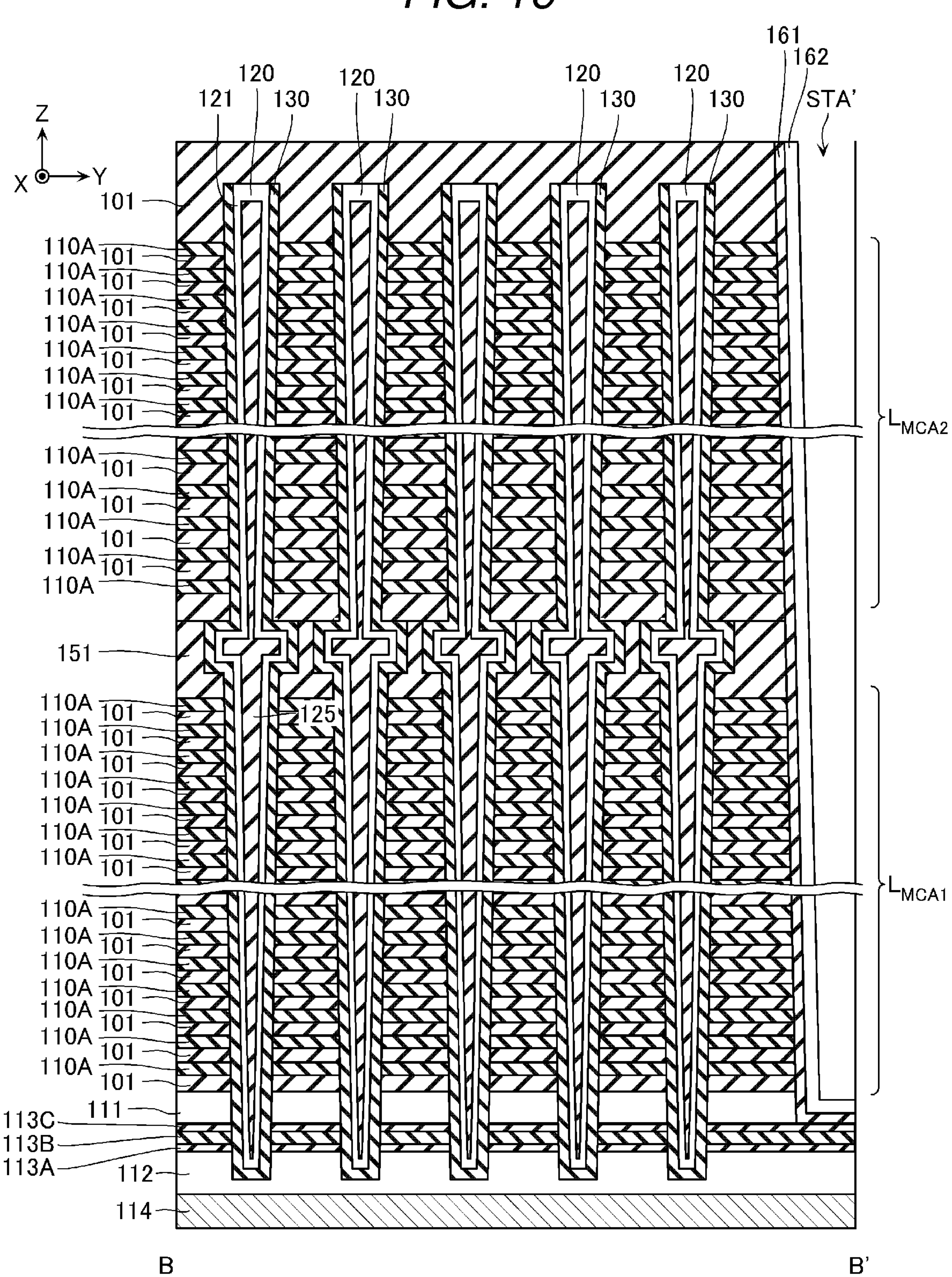

Next, as shown in FIG. 16, the same insulating layer as the insulating layer 101 is formed on the insulating layer 101, and then a trench STA' is formed at a position corresponding to the inter-block structure ST. The trench STA' extends in the Z and X directions, divides the insulating layers 101 and the sacrificial layers 110A in the Y direction, and exposes the semiconductor layer 111. Subsequently, an insulating layer 161 made of silicon oxide, and a semiconductor layer 162 made of amorphous silicon are formed in the trench STA' by, for example, a method such as CVD. This step is performed, for example, by RIE and CVD.

Figure 17:
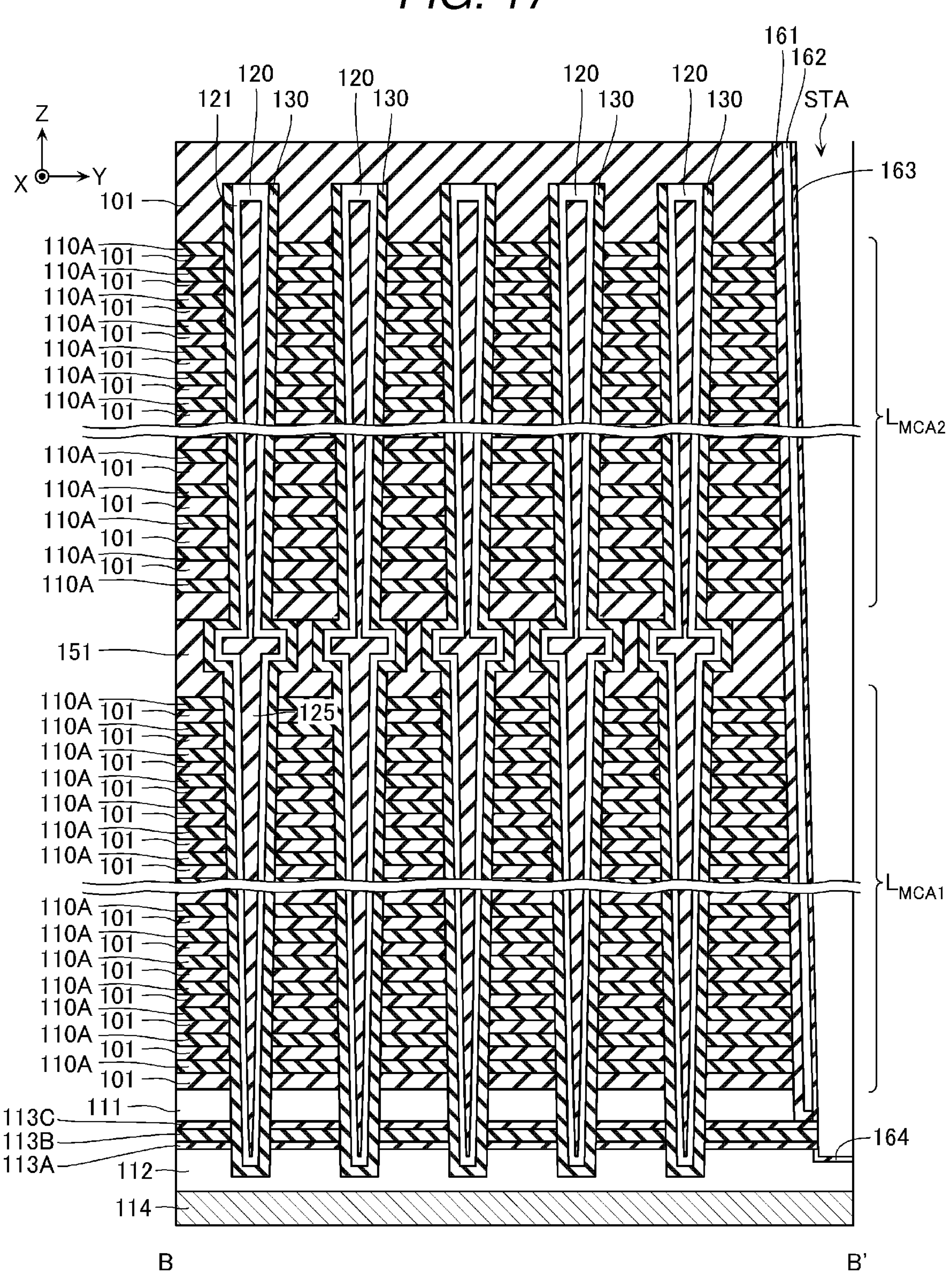

Next, as shown in FIG. 17, a trench STA is formed. The trench STA is formed by removing the semiconductor layer 162, the insulating layer 161, the semiconductor layer 111, and the sacrificial layers 113C, 113B, 113A from the bottom of the trench STA' to divide these layers in the Y direction, and exposing the semiconductor layer 112. This step is performed, for example, by RIE. Subsequently, the semiconductor layer 162 constituting the Y-direction side surfaces of the trench STA, and the semiconductor layer 112 exposed at the bottom of the trench STA are partly oxidized to form an insulating layer 163 and an insulating layer 164, respectively, which are made of, for example, silicon oxide. This step is performed, for example, by thermal oxidation.

Figure 18:
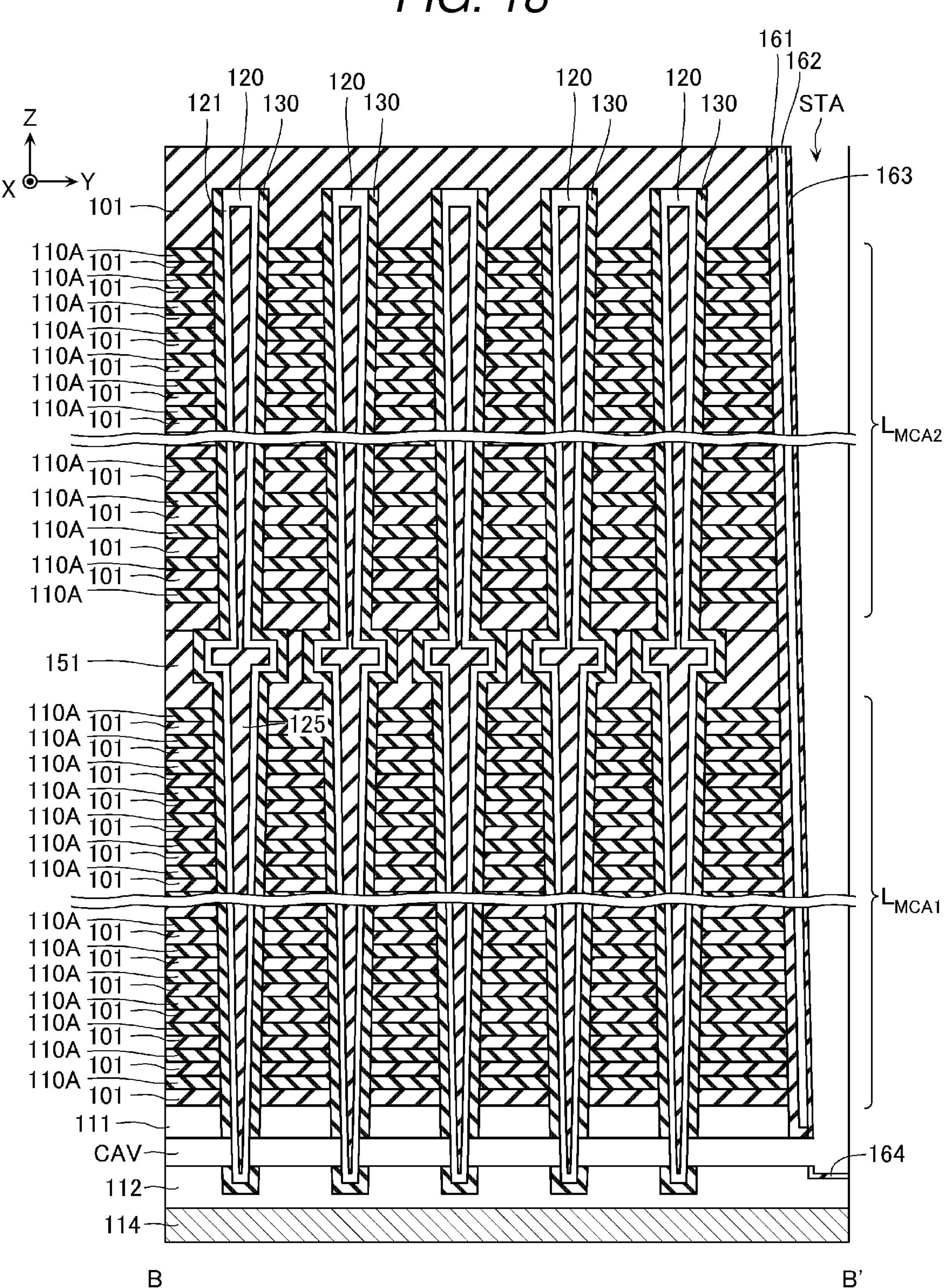

Next, as shown in FIG. 18, the sacrificial layer 113B is removed via the trench STA, and then the sacrificial layers 113A, 113C, and part of each gate insulating film 130 are removed to form a cavity CAV, thereby exposing part of each semiconductor layer 120. This step is performed, for example, by a method such as wet etching.

Figure 19:
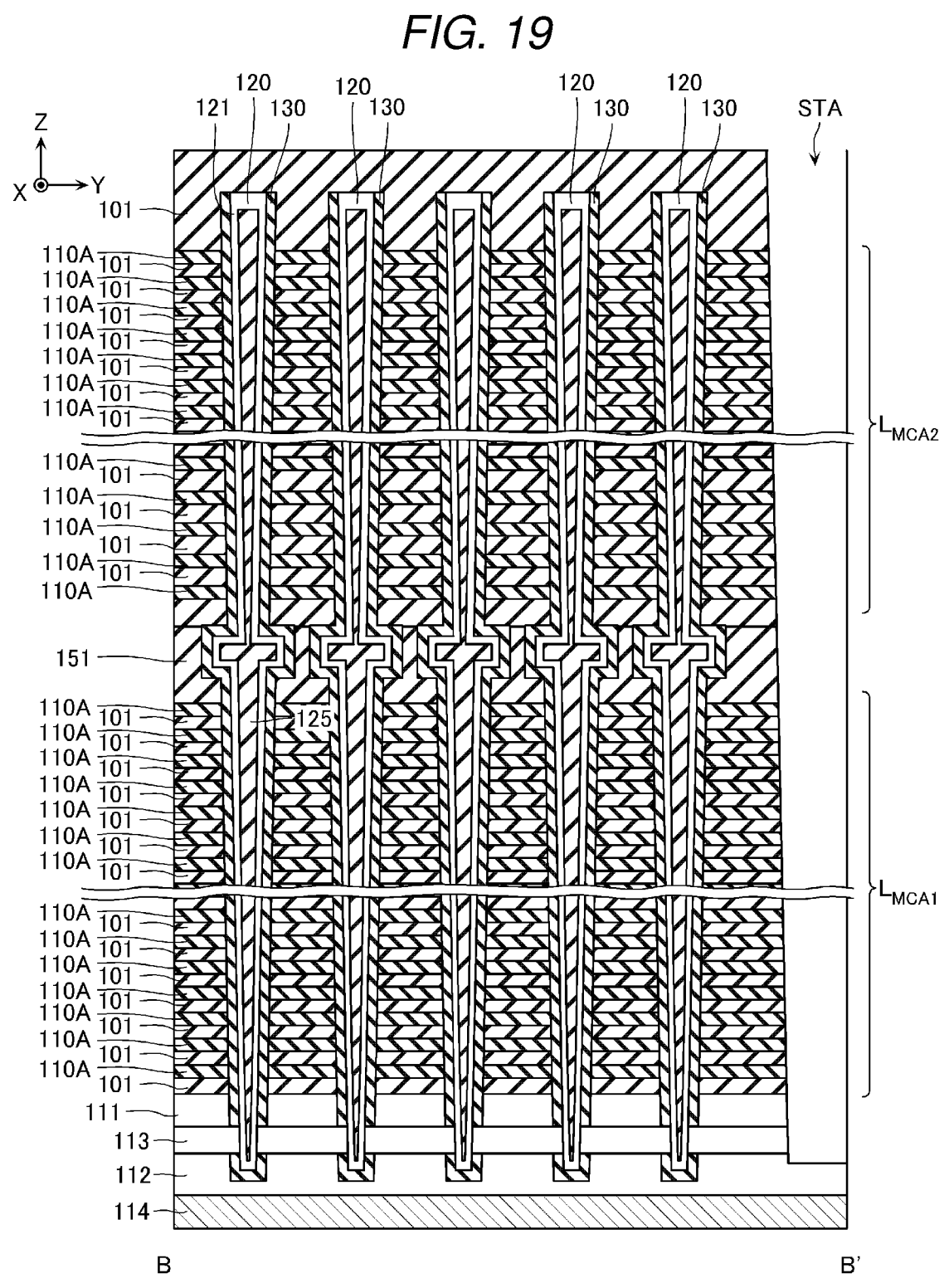

Next, as shown in FIG. 19, a semiconductor layer 113 is formed via the trench STA such that it fills the cavity CAV. This step is performed, for example, by a method such as epitaxial growth. The semiconductor layer 162 and the insulating layer 161 are then removed from the Y-direction side surfaces of the trench STA. This step is performed, for example, by a method such as wet etching.

Figure 20:
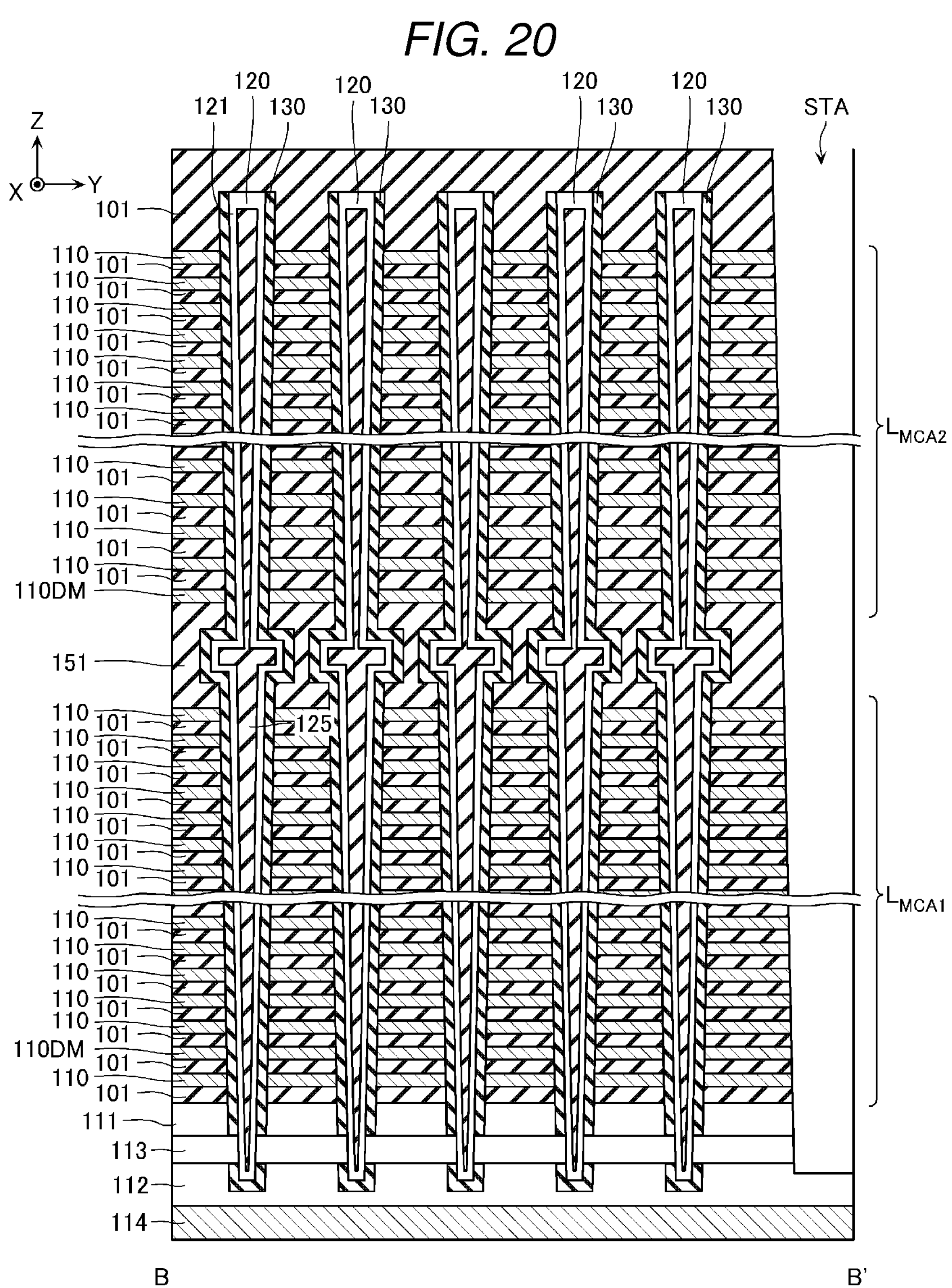

Next, as shown in FIG. 20, the sacrificial layers 110A are removed via the trench STA. Conductive layers 110 and dummy conductive layers 110DM are formed in the cavities formed by the removal of the sacrificial layers 110A. This step is performed, for example, by wet etching and CVD.

Next, an insulating layer is formed in the trench STA to form an inter-block structure ST. Contacts Ch connected to the impurity regions 121 and inter-string unit insulating layers SHE are formed, thereby forming the structure described above with reference to FIG. 5.

Comparative Example Semiconductor Memory Device

Figure 21:
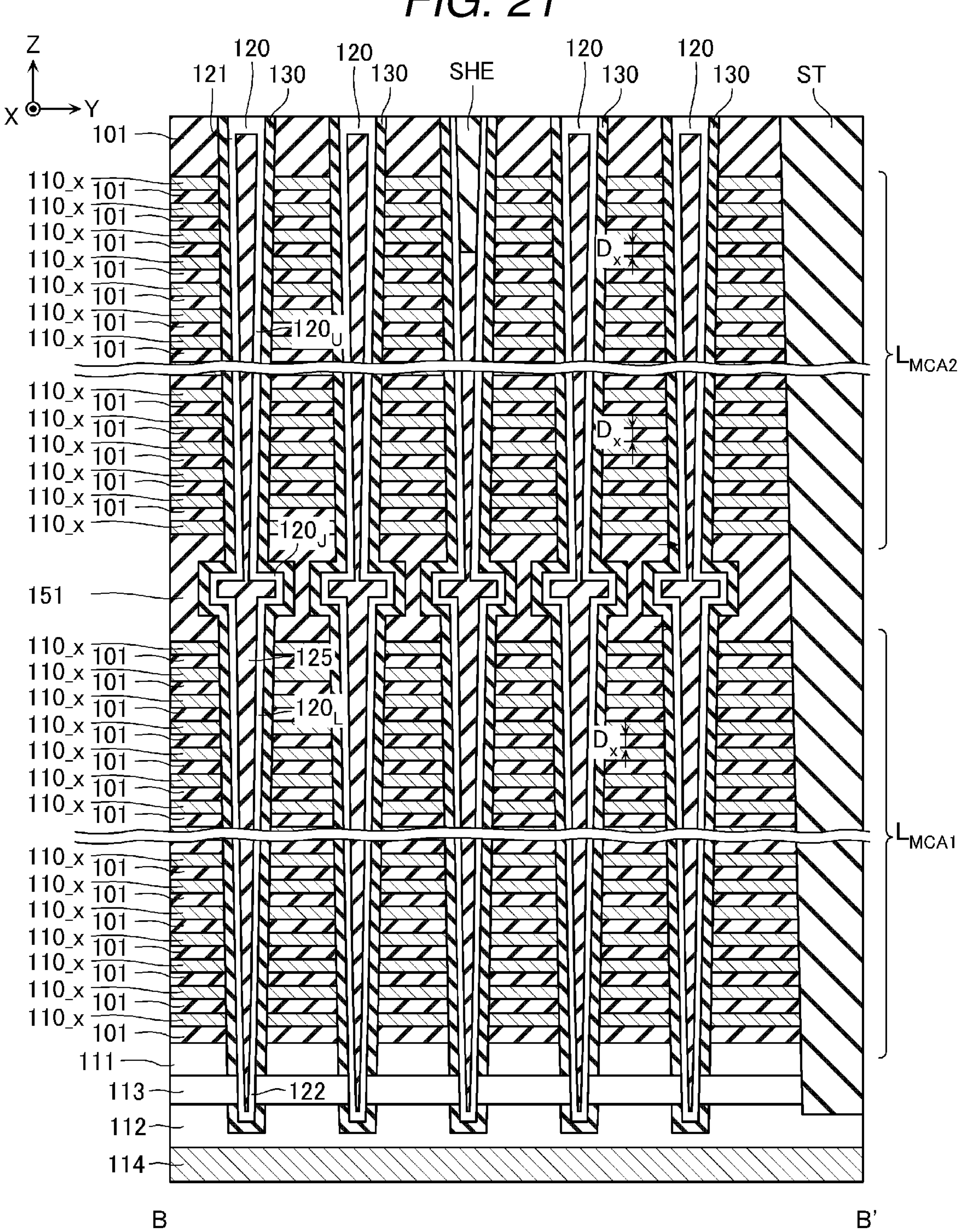
FIG. 21 is a schematic cross-sectional view of a portion of a semiconductor memory device according to a comparative example.

A semiconductor memory device of a comparative example will be described with reference to FIG. 21. FIG. 21 is a schematic cross-sectional view illustrating the semiconductor memory device of the comparative example.

As shown in FIG. 21, the semiconductor memory device of the comparative example includes conductive layers 110_*x* instead of the conductive layers 110. In the memory cell array layers $L_{MCA1}$ and $L_{MCA2}$, the conductive layers 110_*x* are arranged at a pitch Dx in the Z direction. All the conductive layers 110_*x* are thus arranged at the same pitch in the Z direction.

In this comparative semiconductor memory device, the radial width of the semiconductor region $\mathbf{120}_U$ is smaller at a lower portion (the portion nearer to the substrate and to the semiconductor region $\mathbf{120}_J$). The electrical effect between memory cells MC adjacent to each other in the Z direction is sometimes large in the vicinity of the lower end of the semiconductor region $\mathbf{120}_U$. Accordingly, such memory cells MC at the lower portion in this example will sometimes have a poor data retention property as compared to the other memory cells MC.

Effect of First Embodiment

In the semiconductor memory device according to the first embodiment, relatively lower ones of the conductive layers 110 provided in the memory cell array layer $L_{MCA2}$ are arranged at the relatively large pitch $D_{112}$. Such a construction can reduce the electrical effect between memory cells MC adjacent to each other in the Z direction. Therefore, even memory cells MC, provided at positions where the radial width of the semiconductor layer 120 is small can have a good data retention property.

Modification of First Embodiment

Figure 22:
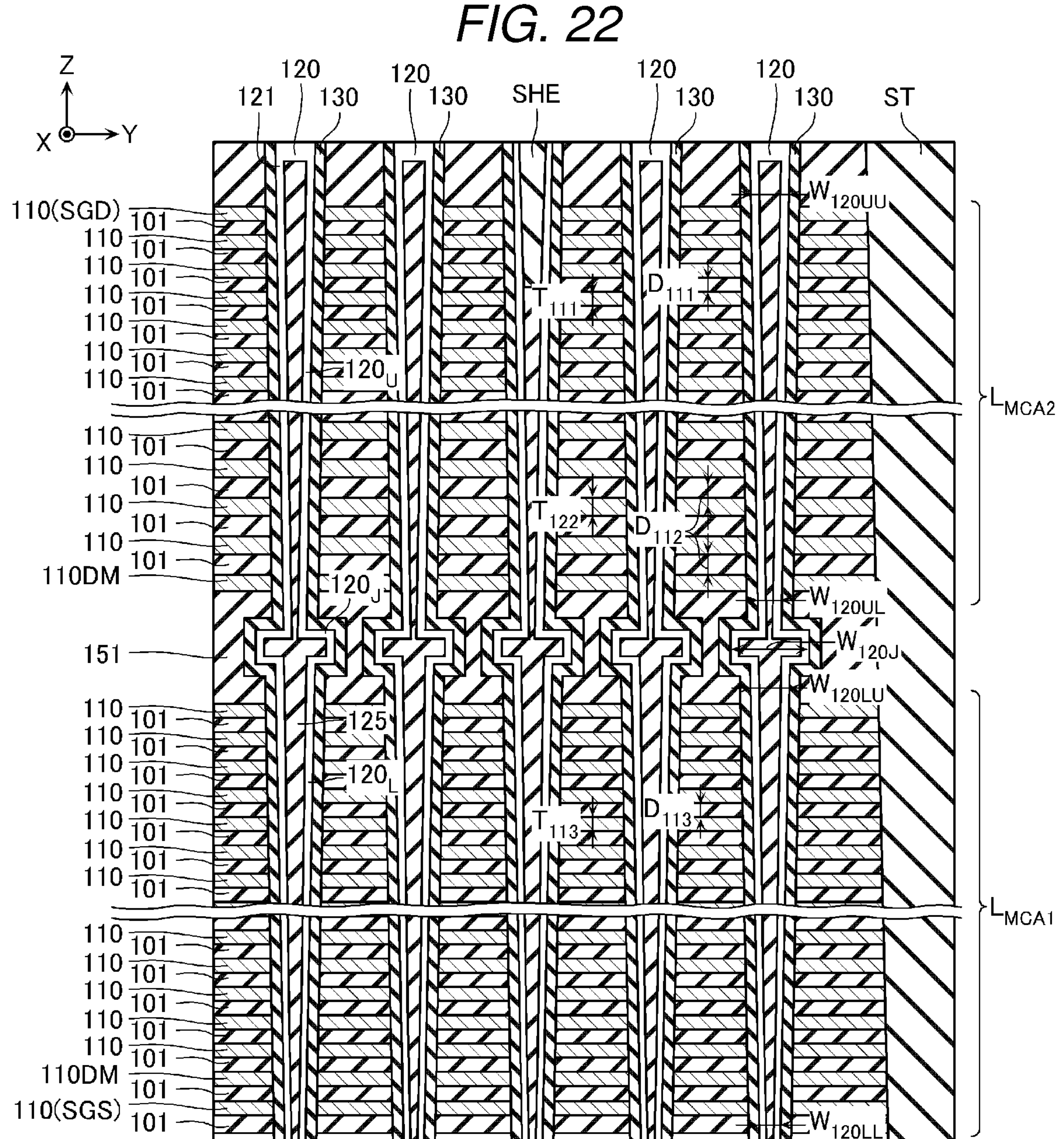
FIG. 22 is a schematic cross-sectional view of a portion of a semiconductor memory device according to a modification of a first embodiment.

A semiconductor memory device according to a modification of the first embodiment will be described with reference to FIG. 22. FIG. 22 is a schematic cross-sectional view illustrating the semiconductor memory device according to the modification of the first embodiment.

Thickness of Conductive Layer 110

As shown in FIG. 22, in the semiconductor memory device according to the modification of the first embodiment, the Z-direction thickness of each of the relatively lower ones of the conductive layers 110 provided in the memory cell array layer $L_{MCA2}$ is not the thickness $T_{112}$ but rather is a thickness $T_{122}$. The thickness $T_{122}$ is larger than the thickness $T_{111}$ and the thickness $T_{113}$.

Effect of the Modification of First Embodiment

In the semiconductor memory device according to the modification of the first embodiment, the relatively lower ones of the conductive layers 110 provided in the memory cell array layer $L_{MCA2}$ each have a relatively large thickness. The increase in the thickness of the conductive layers 110 leads to an increase in the volume of a portion, facing the conductive layers 110, of the charge storage film 132. This enables the charge storage film 132 to store a larger amount of charges. Such a construction can reduce the electrical effect between memory cells MC adjacent to each other in the Z direction. Therefore, even memory cells MC, provided at positions where the radial width of the semiconductor layer 120 is small, can have a good data retention property.

Second Embodiment

Figure 23:
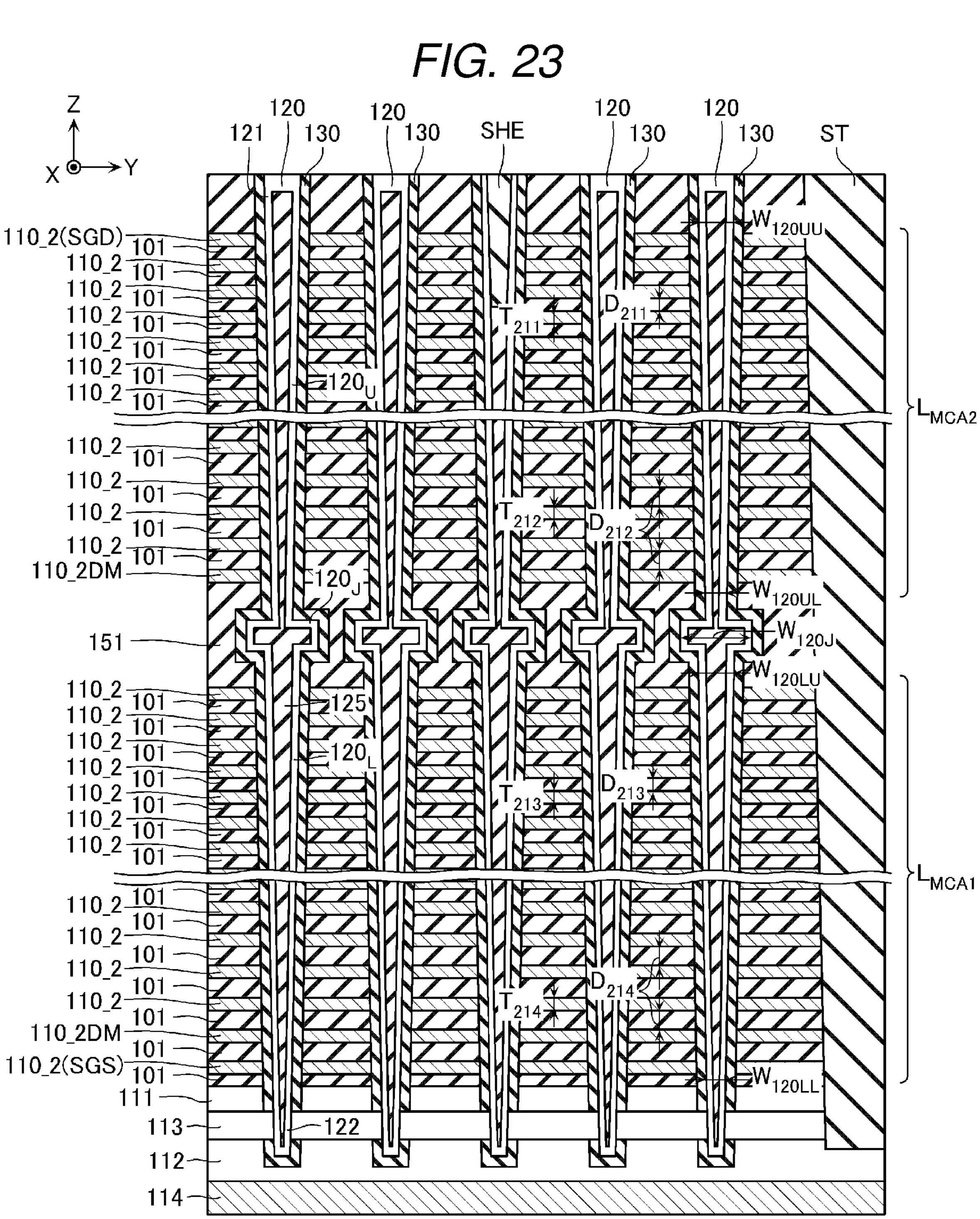
FIG. 23 is a schematic cross-sectional view of a portion of a semiconductor memory device according to a second embodiment.

A semiconductor memory device according to a second embodiment will be described with reference to FIG. 23. FIG. 23 is a schematic cross-sectional view illustrating the semiconductor memory device according to the second embodiment.

The semiconductor memory device according to the second embodiment has the same basic construction as the semiconductor memory device according to the first embodiment except that the second embodiment includes conductive layers 110_2 instead of the conductive layers 110 and dummy conductive layers 110_2DM instead of the dummy conductive layers 110DM.

Pitch of Conductive Layers 110_2

As shown in FIG. 23, relatively upper ones of the conductive layers 110_2 provided in the memory cell array layer $L_{MCA2}$ are arranged at a pitch $D_{211}$ in the Z direction. Relatively lower ones of the conductive layers 110_2 provided in the memory cell array layer $L_{MCA2}$ are arranged at a pitch $D_{212}$ in the Z direction. The dummy conductive layer 110_2DM and the conductive layer 110_2 immediately above are also arranged at the pitch $D_{212}$ in the Z direction. Relatively upper ones of the conductive layers 110_2 provided in the memory cell array layer $L_{MCA1}$ are arranged at a pitch $D_{213}$ in the Z direction. Relatively lower ones of the conductive layers 110_2 provided in the memory cell array layer $L_{MCA1}$ are arranged at a pitch $D_{214}$ in the Z direction. The dummy conductive layer 110_2DM and the conductive layer 110_2 immediately above are also arranged at the pitch $D_{214}$ in the Z direction. The pitch $D_{212}$ and the pitch $D_{214}$ are both larger than the pitch $D_{211}$ and the pitch $D_{213}$.

In such a structure, the thickness of each insulating layer 101 in the region where the conductive layers 110_2 are arranged at the pitch $D_{212}$ and in the region where the conductive layers 110_2 are arranged at the pitch $D_{214}$ is larger than the thickness of each insulating layer 101 in the region where the conductive layers 110_2 are arranged at the pitch $D_{211}$ and in the region where the conductive layers 110_2 are arranged at the pitch $D_{213}$.

Thickness of Conductive Layer 110_2

For example, in FIG. 23, the Z-direction thickness of each of the relatively upper ones of the conductive layers 110_2 provided in the memory cell array layer $L_{MCA2}$ is shown as a thickness $T_{211}$. The Z-direction thickness of each of the relatively lower ones of the conductive layers 110_2 provided in the memory cell array layer $L_{MCA2}$ is shown as a thickness $T_{212}$. The Z-direction thickness of each of the relatively upper ones of the conductive layers 110_2 provided in the memory cell array layer $L_{MCA1}$ is shown as a thickness $T_{213}$. The Z-direction thickness of each of the relatively lower ones of the conductive layers 110_2 provided in the memory cell array layer $L_{MCA1}$ is shown as a thickness $T_{214}$. The thickness $T_{211}$, the thickness $T_{212}$, the thickness $T_{213}$ and the thickness $T_{214}$ are equal in this example.

Effect of Second Embodiment

In the semiconductor memory device according to the second embodiment, the relatively lower ones of the conductive layers 110_2 provided in the memory cell array layer $L_{MCA1}$ are arranged at the relatively large pitch $D_{214}$. Therefore, in such a structure, not only the relatively lower ones of the conductive layers 110_2 provided in the memory cell array layer $L_{MCA2}$, but also the relatively lower ones of the conductive layers 110_2 provided in the memory cell array layer $L_{MCA1}$ can have a good data retention property.

Modification of Second Embodiment

Figure 24:
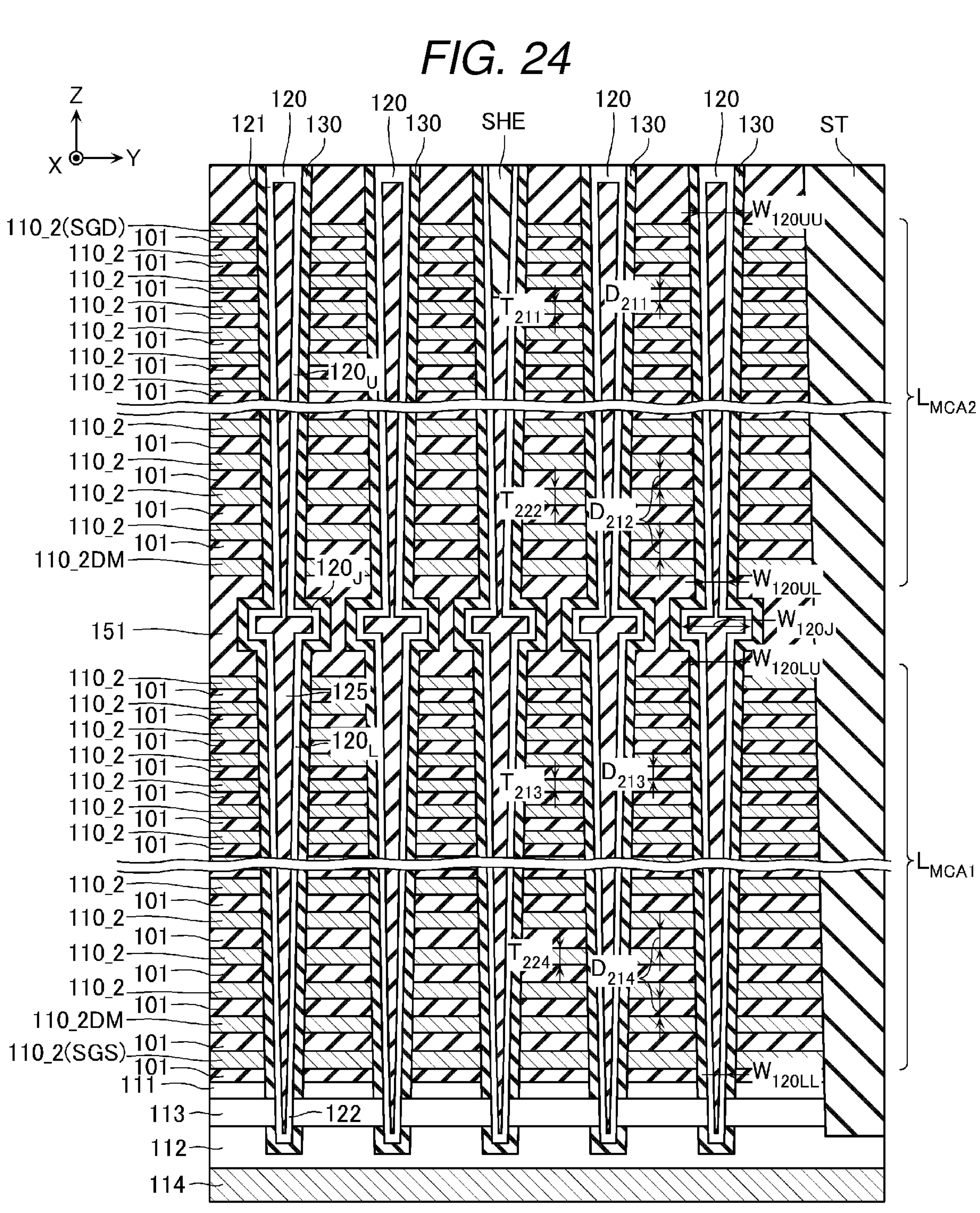
FIG. 24 is a schematic cross-sectional view of a portion of a semiconductor memory device according to a modification of a second embodiment.

A semiconductor memory device according to a modification of the second embodiment will be described with reference to FIG. 24. FIG. 24 is a schematic cross-sectional view illustrating the semiconductor memory device according to the modification of the second embodiment.

Thickness of Conductive Layer 110_2

As shown in FIG. 24, in the semiconductor memory device according to the modification of the second embodiment, the Z-direction thickness of each of the relatively lower ones of the conductive layers 110_2 provided in the memory cell array layer $L_{MCA2}$ is not the thickness $T_{212}$ but is rather a thickness $T_{222}$. Further, the Z-direction thickness of each of the relatively lower ones of the conductive layers 110_2 provided in the memory cell array layer $L_{MCA1}$ is not the thickness $T_{214}$ but rather is a thickness $T_{224}$. In some examples, at least one of the thickness $T_{222}$ and the thickness $T_{224}$ may be larger than the thickness $T_{211}$ and the thickness $T_{213}$.

Third Embodiment

Figure 25:
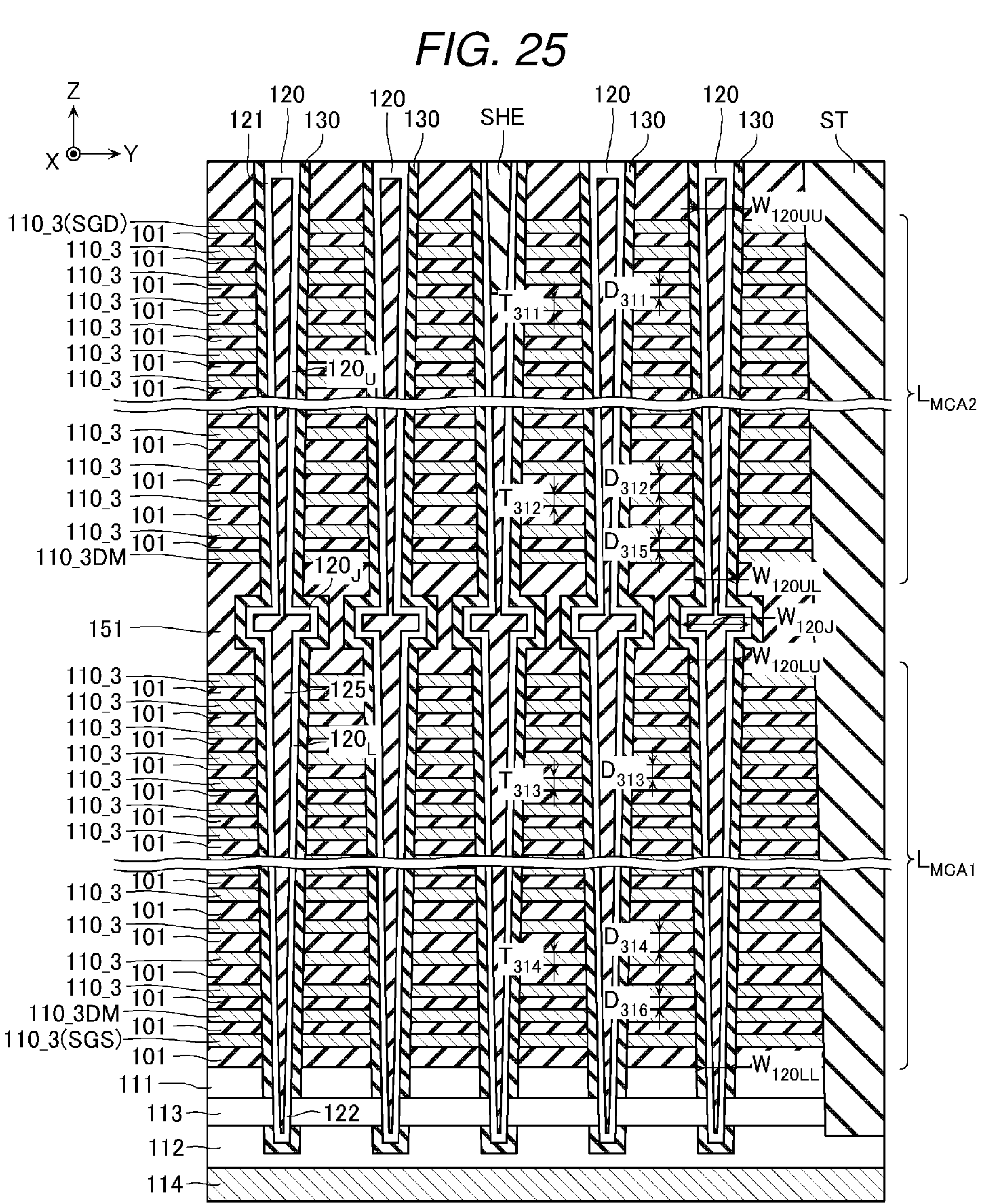
FIG. 25 is a schematic cross-sectional view of a portion of a semiconductor memory device according to a third embodiment.

A semiconductor memory device according to a third embodiment will be described with reference to FIG. 25. FIG. 25 is a schematic cross-sectional view illustrating the semiconductor memory device according to the third embodiment.

The semiconductor memory device according to the third embodiment has the same basic construction as the semiconductor memory device according to the first embodiment except that the third embodiment includes conductive layers 110_3 instead of the conductive layers 110, and includes dummy conductive layers 110_3DM instead of the dummy conductive layers 110DM.

Pitch of Conductive Layers 110_3

As shown in FIG. 25, relatively upper ones of the conductive layers 110_3 provided in the memory cell array layer $L_{MCA2}$ are arranged at a pitch $D_{311}$ in the Z direction. Relatively lower ones of the conductive layers 110_3 provided in the memory cell array layer $L_{MCA2}$ are arranged at a pitch $D_{312}$ in the Z direction. Relatively upper ones of the conductive layers 110_3 provided in the memory cell array layer $L_{MCA1}$ are arranged at a pitch $D_{313}$ in the Z direction. Relatively lower ones of the conductive layers 110_3 provided in the memory cell array layer $L_{MCA1}$ are arranged at a pitch $D_{314}$ in the Z direction. At least one of the pitch $D_{312}$ and the pitch $D_{314}$ can be larger than the pitch $D_{311}$ and the pitch $D_{313}$ in some examples.

Pitch Between Dummy Conductive Layer 110_3DM and Conductive Layer 110_3

As shown in FIG. 25, in the memory cell array layer $L_{MCA2}$, the dummy conductive layer 110_3DM and the adjacent conductive layer 110_3 are arranged at a pitch $D_{315}$ in the Z direction. In a lower portion of the memory cell array layer $L_{MCA1}$, the dummy conductive layer 110_3DM and the adjacent conductive layer 110_3 are arranged at a pitch $D_{316}$ in the Z direction. The pitch $D_{315}$ and the pitch $D_{316}$ can be equal to the pitch $D_{311}$ and the pitch $D_{313}$.

In such a structure, the thickness of the insulating layer 101 provided between each dummy conductive layer 110_3DM and the adjacent conductive layer 110_3 may be equal to the thickness of each insulating layer 101 in the region where the conductive layers 110_3 are arranged at the pitch $D_{311}$ and in the region where the conductive layers 110_3 are arranged at the pitch $D_{313}$.

Thickness of Conductive Layer 110_3

For example, in FIG. 25, the Z-direction thickness of each of the relatively upper ones of the conductive layers 110_3 provided in the memory cell array layer $L_{MCA2}$ is shown as a thickness $T_{311}$. The Z-direction thickness of each of the relatively lower ones of the conductive layers 110_3 provided in the memory cell array layer $L_{MCA2}$ is shown as a thickness $T_{312}$. The Z-direction thickness of each of the relatively upper ones of the conductive layers 110_3 provided in the memory cell array layer $L_{MCA1}$ is shown as a thickness $T_{313}$. The Z-direction thickness of each of the relatively lower ones of the conductive layers 110_3 provided in the memory cell array layer $L_{MCA1}$ is shown as a thickness $T_{314}$.

The thickness $T_{311}$, the thickness $T_{312}$, the thickness $T_{313}$ and the thickness $T_{314}$ may be equal to one another in some examples. In other examples, at least one of the thickness $T_{312}$ and the thickness $T_{314}$ may be larger than the thickness $T_{311}$ and the thickness $T_{313}$.

Effect of Third Embodiment

A memory cell MC for recording data is not provided between the dummy conductive layer 110_3DM and the semiconductor layer 120. A dummy memory cell structure may be provided. In any event, the distance between the dummy conductive layer 110_3DM and the adjacent conductive layer 110_3 has no influence on the data retention property of any actual (non-dummy) memory cell MC. In this third embodiment, therefore, the thickness of the insulating layer 101 between each dummy conductive layer 110_3DM and the adjacent conductive layer 110_3 is thus not made to be large. This enables the manufacturing of a semiconductor memory device of a smaller overall size than otherwise would be the case.

Fourth Embodiment

Figure 26:
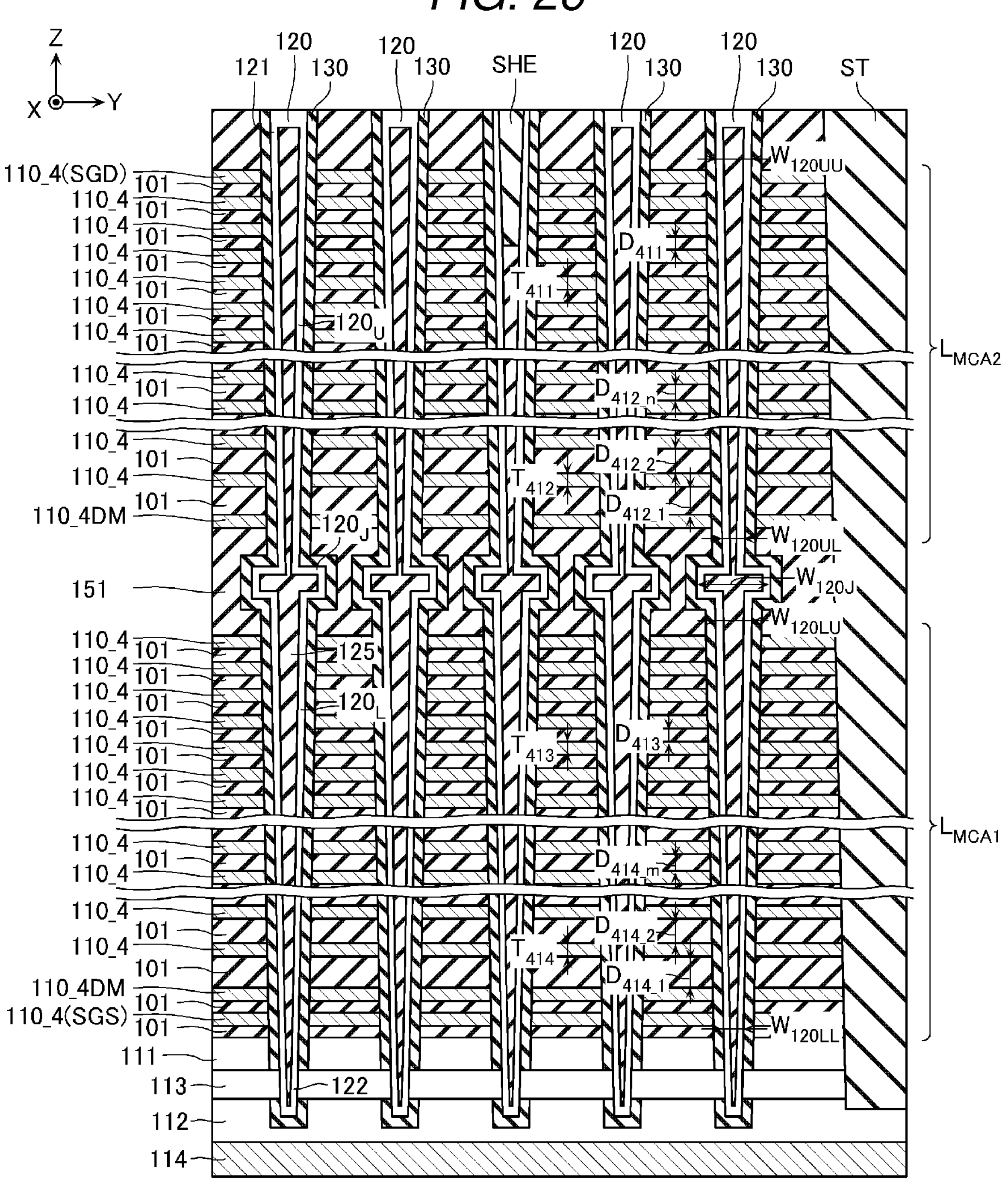
FIG. 26 is a schematic cross-sectional view showing of a portion of a semiconductor memory device according to a fourth embodiment.

A semiconductor memory device according to a fourth embodiment will be described with reference to FIG. 26. FIG. 26 is a schematic cross-sectional view illustrating a semiconductor memory device according to this fourth embodiment.

The semiconductor memory device according to this fourth embodiment basically has the same construction as a semiconductor memory device according to the first embodiment, except that the fourth embodiment includes conductive layers 110_4 instead of the conductive layers 110 and dummy conductive layers 110_4DM instead of the dummy conductive layers 110DM.

Pitch of Conductive Layers 110_4

As shown in FIG. 26, relatively upper ones of the conductive layers 110_4 provided in the memory cell array layer $L_{MCA2}$ are arranged at a pitch $D_{411}$ in the Z direction.

On the other hand, the conductive layers 110_4 provided in the memory cell array layer $L_{MCA2}$ may be arranged in the Z direction such that conductive layers 110_4 located at lower positions are arranged at a somewhat larger pitch. As shown in FIG. 26, the Z-direction pitch of the conductive layers 110_4 and the dummy conductive layer 110_4DM may gradually decrease from a pitch $D_{412\_1}$ to a pitch $D_{412\_n}$ (where n is an integer equal to or greater than 1) from the bottom toward the top of the memory cell array layer $L_{MCA2}$. The pitch $D_{412\_1}$ may be larger than the pitch $D_{411}$, and the pitch $D_{412\_n}$ may be equal to the pitch $D_{411}$.

Relatively upper ones of the conductive layers 110_4 provided in the memory cell array layer $L_{MCA1}$ are arranged at a pitch $D_{413}$ in the Z direction.

On the other hand, the conductive layers 110_4 provided in the memory cell array layer $L_{MCA1}$ may be arranged in the Z direction such that conductive layers 110_4 located at lower positions are arranged at a somewhat larger pitch. As shown in FIG. 26, the Z-direction pitch of the dummy conductive layer 110_4DM and the conductive layers 110_4 located above it may gradually decrease from a pitch $D_{414\_1}$ to pitch $D_{414\_m}$ (where m is an integer equal to or greater than 1) in a direction from the bottom toward the top of the memory cell array layer $L_{MCA1}$. The pitch $D_{414\_1}$ may be larger than the pitch $D_{413}$, but the pitch $D_{414\_m}$ may be equal to the pitch $D_{413}$.

Thickness of Conductive Layer 110_4

For example, in FIG. 26, the Z-direction thickness of each of the relatively upper ones of the conductive layers 110_4 provided in the memory cell array layer $L_{MCA2}$ is shown as a thickness $T_{411}$. The Z-direction thickness of each of the relatively lower ones of the conductive layers 110_4 provided in the memory cell array layer $L_{MCA2}$ is shown as a thickness $T_{412}$. The Z-direction thickness of each of the relatively upper ones of the conductive layers 110_4 provided in the memory cell array layer $L_{MCA1}$ is shown as a thickness $T_{413}$. The Z-direction thickness of each of the relatively lower ones of the conductive layers 110_4 provided in the memory cell array layer $L_{MCA1}$ is shown as a thickness $T_{414}$.

The thickness $T_{411}$, the thickness $T_{412}$, the thickness $T_{413}$ and the thickness $T_{414}$ may be equal to one another in some examples. In other examples, at least one of the thickness $T_{412}$ and the thickness $T_{414}$ may be larger than the thickness $T_{411}$ and the thickness $T_{413}$.

Other Embodiments

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor memory device, comprising:

a plurality of first conductive layers stacked on a substrate along a first direction at a first pitch;

a plurality of second conductive layers stacked on the substrate along the first direction at a second pitch, the plurality of second conductive layers being between the substrate and the plurality of first conductive layers in the first direction;

a plurality of third conductive layers stacked on the substrate along the first direction at a third pitch, the plurality of third conductive layers being between the substrate and the plurality of second conductive layers in the first direction; and a semiconductor layer extending in the first direction through the first conductive layers, the second conductive layers, and the third conductive layers; and a charge storage film extending along the semiconductor layer in the first direction, the charge storage film being between the semiconductor layer and the first, second, and third conductive layers, wherein the semiconductor layer has a first portion facing the first conductive layers and the second conductive layers and a second portion facing the third conductive layers, the second pitch is greater than the first pitch and the third pitch, each of the first conductive layers has a first thickness in the first direction, each of the second conductive layers has a second thickness in the first direction, the second thickness is greater than the first thickness, and a first charge storage film portion of the charge storage film between the semiconductor layer and one of the plurality of first conductive layers has a smaller cross-sectional area in a cross-section view parallel to the first direction than a second charge storage film portion of the charge storage film between the semiconductor layer and one of the plurality of second conductive layers in the cross-section view.

2. The semiconductor memory device according to claim 1, wherein a first end of the first portion of the semiconductor layer farthest from the substrate in the first direction has a first width in a second direction intersecting the first direction, a second end of the first portion of the semiconductor layer nearest the substrate in the first direction has a second width in the second direction, a third end of the second portion of the semiconductor layer nearest the second conductive layers in the first direction has a third width in the second direction, a fourth end of the second portion nearest the substrate in the first direction has a fourth width in the second direction, the first width is greater than the second width, and the third width is greater than the fourth width.

3. The semiconductor memory device according to claim 2, wherein the semiconductor layer includes a third portion between the first portion and the second portion in the first direction, the third portion having a fifth width in the second direction that is greater than the second width and the third width.

4. The semiconductor memory device according to claim 1, wherein the first portion of the semiconductor layer tapers in width in the second direction as distance from the substrate decreases along the first direction, and the second portion of the semiconductor layers tapers in width in the second direction as distance from the substrate decreases along the first direction.

5. The semiconductor memory device according to claim 4, wherein the semiconductor layer has a third portion between the first and second portions in the first direction, and the third portion has a width in the second direction that is greater than the maximum widths of the first and second portions in the second direction.

6. The semiconductor memory device according to claim 5, wherein the third portion does not face, in the second direction, any of the plurality of first conductive layers, the plurality of second conductive layers, or the plurality of third conductive layers.

7. The semiconductor memory device according to claim 1, further comprising:

a plurality of fourth conductive layers stacked on the substrate along the first direction at a fourth pitch, the plurality of fourth conductive layer being between the substrate and the plurality of third conductive layers in the first direction, wherein the fourth pitch is greater than the first pitch, and the fourth pitch is greater than the third pitch.

8. The semiconductor memory device according to claim 7, further comprising:

a dummy conductive layer between the plurality of fourth conductive layers and the substrate in the first direction.

9. The semiconductor memory device according to claim 1, further comprising:

a dummy conductive layer between the plurality of second conductive layers and the plurality of third conductive layers in the first direction.

10. The semiconductor memory device according to claim 9, wherein a distance, in the first direction, from the dummy conductive layer and the nearest one of the second conductive layers is less than the second pitch.

11. The semiconductor memory device according to claim 1, wherein the first pitch is equal to the third pitch.

12. The semiconductor memory device according to claim 1, further comprising:

a joint portion of the semiconductor layer between the plurality of second conductive layers and the plurality of third conductive layers, the joint portion having a larger width in the second direction than the first portion of the semiconductor layer and the second portion of the semiconductor layer.

13. The semiconductor memory device according to claim 1, wherein the first charge storage film portion has a same width in the second direction as the second charge storage film portion.

14. The semiconductor memory device according to claim 6, wherein each of the third conductive layers has a third thickness in the first direction, and the second thickness is greater than the third thickness.

15. The semiconductor memory device according to claim 1, wherein each of the third conductive layers has a third thickness in the first direction, and the second thickness is greater than the third thickness.

16. The semiconductor memory device according to claim 15, wherein a third charge storage film portion of the charge storage film facing one of the plurality of third conductive layers has a smaller cross-sectional area in the cross-section view parallel to the first direction than the second charge storage film portion.

17. A semiconductor memory device, comprising:

a plurality of first conductive layers stacked on a substrate along a first direction at a first pitch;

a plurality of second conductive layers stacked on the substrate along the first direction at a second pitch, the plurality of second conductive layers being between the substrate and the plurality of first conductive layers in the first direction;

a plurality of third conductive layers stacked on the substrate along the first direction, the plurality of third conductive layers being between the substrate and the plurality of second conductive layers in the first direction; and a memory pillar extending in the first direction through the first conductive layers, the second conductive layers and the third conductive layers, wherein the memory pillar includes a charge storage film extending in the first direction along a length of the memory pillar in the first direction, the charge storage film being on a peripheral surface of the memory pillar, the memory pillar has a first portion facing the first conductive layers and the second conductive layers, a second portion facing the third conductive layers, and a joint portion between the first and second portions in the first direction, the first portion of the memory pillar narrows in width from a first end that is farthest from the joint portion in the first direction to a second end that is nearest the joint portion in the first direction, the second pitch is different from the first pitch, each of the first conductive layers has a first thickness in the first direction, each of the second conductive layers has a second thickness in the first direction, the second thickness is greater than the first thickness, and a first charge storage film portion of the charge storage film facing one of the plurality of first conductive layers has a smaller cross-sectional area in a cross-section view parallel to the first direction than a second charge storage film portion of the charge storage film facing one of the plurality of second conductive layers in the cross-section view.

18. The semiconductor memory device according to claim 17, wherein the second portion of the memory pillar narrows in width from a third end nearest the joint portion in the first direction to a fourth end farthest from the joint portion in the first direction, and the plurality of third conductive layers are stacked at a third pitch that is different from the second pitch.

19. The semiconductor memory device according to claim 18, further comprising:

a plurality of fourth conductive layers stacked on the substrate along the first direction at a fourth pitch, the plurality of fourth conductive layers facing the second portion of the memory pillar and being between the plurality of third conductive layers and the substrate in the first direction, wherein the fourth pitch is different from the third pitch.

20. The semiconductor memory device according to claim 19, wherein the second pitch is greater than the first pitch, and the fourth pitch is greater than the third pitch.

* * * * *